United States Patent [19]

Maneatis et al.

[11] Patent Number: 5,717,362
[45] Date of Patent: Feb. 10, 1998

[54] ARRAY OSCILLATOR CIRCUIT

[75] Inventors: John George Maneatis, San Mateo County; Mark Alan Horowitz, Santa Clara County, both of Calif.

[73] Assignee: The Board of Trustees of the Leland Stanford Junior University, Stanford, Calif.

[21] Appl. No.: 570,240

[22] Filed: Dec. 11, 1995

Related U.S. Application Data

[63] Continuation of Ser. No. 200,776, Feb. 22, 1994, Pat. No. 5,475,344.

[51] Int. Cl.$^6$ .............................. H03B 27/00; H03B 5/00
[52] U.S. Cl. ........................ 331/57; 327/266; 327/158; 327/262; 327/287; 327/280; 326/115; 326/37
[58] Field of Search ...................... 331/57; 327/264, 327/158, 262, 261, 263, 266, 269, 270, 271, 272, 276, 274, 280, 287; 326/115, 37, 68, 83, 17, 91, 103, 85, 20

[56] References Cited

U.S. PATENT DOCUMENTS

| | | | |
|---|---|---|---|
| 5,268,656 | 12/1993 | Muscavage | 331/45 |
| 5,347,234 | 9/1994 | Gersbach et al. | 331/57 |
| 5,426,398 | 6/1995 | Kuo | 331/57 |
| 5,475,344 | 12/1995 | Maneatis et al. | 331/57 |

OTHER PUBLICATIONS

"Wide-Range, Variable-Frequency Oscillator Circuit"; IBM Technical Disclosure Bulletin; vol. 30, No. 3; Aug. 1987; pp. 1181–1182.

"A Single-Chip, Functional Tester for VLSI Circuits"; J.A. Gasbarro et al.; 1990 IEEE Intl. Solid-State Circuit Conference, Digest of Technical Papers; pp. 84–85.

"A PLL Clock Generator with 5 to 110MHz Lock Range for Microprocessors"; I.A. Young et al.; 1992 IEEE Intl. Solid-State Circuits Conference; pp. 50–51.

*Primary Examiner*—Robert Pascal
*Assistant Examiner*—Arnold Kinkead
*Attorney, Agent, or Firm*—Gary S. Williams; Flehr Hohbach Test Albritton & Herbert LLP

[57] ABSTRACT

An array oscillator circuit is disclosed herein. The array oscillator circuit includes a plurality of ring oscillators, each ring oscillator having a plurality of buffer stages for generating output signals on a like plurality of oscillator output ports. Interconnections are provided between each of the plurality of ring oscillators and at least one other of the plurality of ring oscillators such that the plurality of ring oscillators oscillate at identical frequencies and such that the output signals on the each ring oscillator's plurality of oscillator output ports have a phase offset from the signals generated on corresponding ones of the other ring oscillator's oscillator output ports. A multiplexer provides an electrical connection to a selected one of the plurality of oscillator output ports of the plurality of ring oscillators.

22 Claims, 25 Drawing Sheets

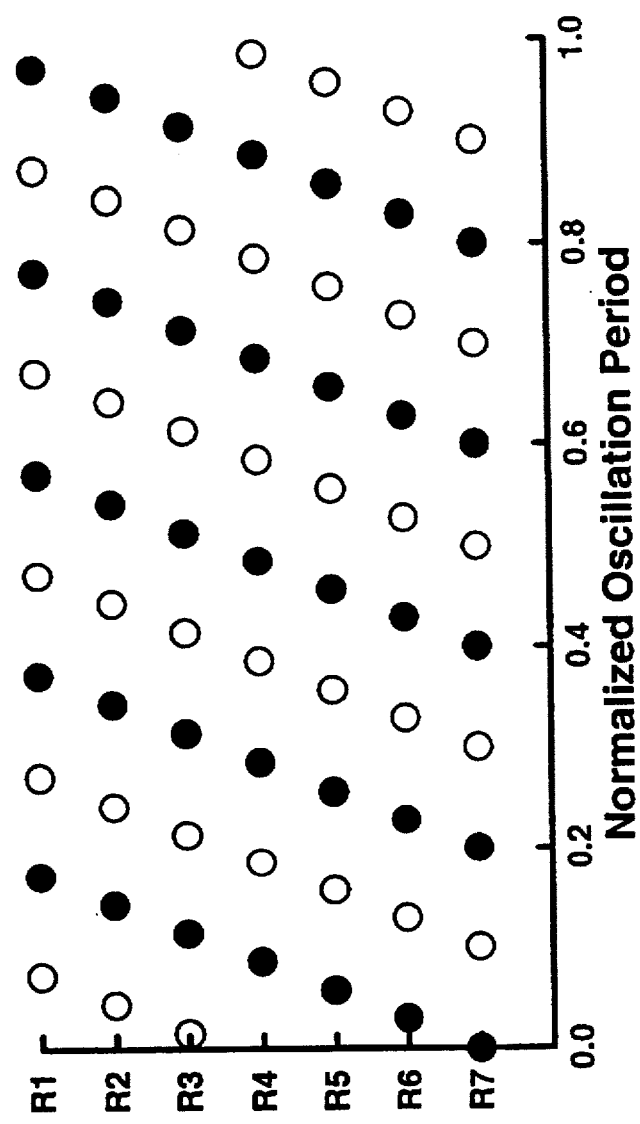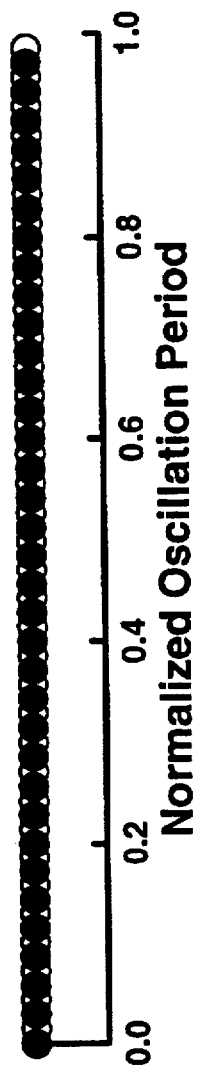
FIG. 8
FIG. 9

ARRAY OSCILLATOR CIRCUIT

This is a continuation of application Ser. No. 08/200,776 filed Feb. 22, 1994 now U.S. Pat. No. 5,475,344.

This invention was made with Government support under contract N00039-91-C-0138 awarded by the Department of the Navy. The Government has certain rights in this invention.

The present invention relates generally to ring oscillator circuits for use as phase delay generators. More particularly, the present invention relates to a novel array oscillator for providing a plurality of phase-delayed versions of an input waveform.

BACKGROUND OF THE INVENTION

Testing and evaluation of digital integrated circuits generally requires the availability of a set of identical digital input waveforms mutually offset in phase. The requisite set of input waveforms may be produced by, for example, phase-locking a delay generator circuit to a reference clock signal. A plurality of phase-shifted replicas of the reference clock signal are then provided by at the various output ports of the delay generator. As is well known, delay generators are often realized using some form of a ring oscillator circuit.

Referring to FIG. 1, there is shown a simplified block diagram of a phase locked loop (PLL) operative to lock the frequency and phase of a reference clock signal to a ring oscillator 10. Once the oscillator 10 becomes locked in frequency and phase to the reference clock signal, a constant phase delay will appear between each of the signals available at adjacent ones of the ring oscillator outputs $O_i$, i=1 to N. Any desired pair of outputs $O_i$ may then be coupled to output terminal $T_1$ and $T_2$ by a double multiplexer 11. A pair of outputs $O_i$, rather than merely a single output $O$, is provided in order that an arbitrary one of the terminals $T_1$ and $T_2$ serve as a reference terminal. The output terminal $T_1$ and $T_2$ will typically be connected to test equipment (not shown) for evaluating integrated circuit performance.

As is indicated by FIG. 1, the signal generated at the $N^{th}$ ring oscillator output $O_N$ is provided to one input of a phase comparator 12. The phase comparator 12 then produces either a PUMP UP (UP) or PUMP DOWN (DN) error signal based on the relative phase between the oscillator output $O_N$ and the reference clock signal. The UP or DN error signal produced by phase comparator 12 is then integrated by a charge pump circuit 14 configured as a conventional integrator. A low-pass loop filter 16, connected between the charge pump 14 and a tuning port of the ring oscillator 10, is used to remove the high-frequency components from the integrated phase error signal. The oscillation frequency of the oscillator 10 is then forced to the frequency of the reference clock signal in accordance with the resultant control voltage $V_C$.

Turning now to FIG. 2, the ring oscillator 10 is seen to include a set of N serially-connected buffer inverters 20. As is indicated by FIG. 2, the output port of each buffer inverter 20 defines one of the outputs $O_i$ of the ring oscillator 10. A closed loop is seen to be established within the ring oscillator 10 by connection of the oscillator output $O_N$ to an input of the buffer inverter 20 defining oscillator output $O_1$. The delay through each buffer inverter 20 is equivalent to the period of the reference signal divided by 2N, and is set by the value of the control voltage $V_C$. That is, the value of the control voltage $V_C$ determines the delay through each buffer inverter 20 and thereby controls the operating frequency of the ring oscillator 10. The control voltage $V_C$ will reach a constant value once the ring oscillator 10 becomes phase locked to the reference clock signal.

FIGS. 3A and 3B illustratively represent the phase relationship among the oscillator outputs $O_i$, i=1 to N for the exemplary case of N=5, which exists during steady-state oscillation of the ring oscillator 10. Specifically, FIG. 3A depicts the waveform produced at output $O_1$ during a single oscillation period of the oscillator 10. The rising transitions in the waveform of FIG. 3A at the beginning and end of the oscillation period are identified by filled circles, and the falling transition midway therebetween is identified using an open circle. Similarly, FIG. 3B illustrates represents the timing of the rising and falling transitions at each of the outputs $O_1$–$O_5$ during the oscillation period described with reference to FIG. 3A. As is indicated by FIG. 3B, the rising transition at output $O_1$ at the beginning of the oscillation period induces a corresponding falling transition to occur at output $O_2$ subsequent to a delay of 0.1 oscillation periods. Assuming that both inverting and non-inverting outputs of each buffer inverter 20 are capable of being tapped, a total of ten different output phases uniformly spanning the output period are made available by the ring oscillator 10.

Unfortunately, when the ring oscillator 10 is utilized as a delay generator the delay resolution between successive outputs $O_i$ is limited by the signal delay introduced by a single one of the buffer inverters 20. Additional output phases could be made available during each oscillation period by increasing the number of inverting buffers within the ring oscillator, but such an increase effectively reduces the maximum oscillation frequency. The net result is that the achievable delay resolution remains equivalent to a single buffer delay.

Accordingly, it is an object of the present invention to provide a ring-like oscillator circuit in which the number of buffer inverters may be increased without concomitantly reducing the maximum oscillation frequency. Such a circuit architecture would advantageously allow a delay resolution of less than a buffer delay to be achieved.

SUMMARY OF THE INVENTION

In summary, the present invention is an array oscillator circuit. The inventive array oscillator circuit includes a plurality of ring oscillators, each ring oscillator having a plurality of buffer stages for generating output signals on a like plurality of oscillator output ports. Interconnections are provided between each of the plurality of ring oscillators and at least one other of the plurality of ring oscillators such that the plurality of ring oscillators oscillate at identical frequencies and such that the output signals on the each ring oscillator's plurality of oscillator output ports have a phase offset from the signals generated on corresponding ones of the other ring oscillator's oscillator output ports. A multiplexer provides an electrical connection to a selected one of the plurality of oscillator output ports of the plurality of ring oscillators.

BRIEF DESCRIPTION OF THE DRAWINGS

Additional objects and features of the invention will be more readily apparent from the following detailed description and appended claims when taken in conjunction with the drawings, in which:

FIG. 8 illustratively represents the phase relationship existing among the buffer stage outputs for an array oscillator containing seven rings, each of which include five buffer stages, for the case where a phase shift of two buffer delays is imposed at the array boundary.

FIG. 9 illustratively represents the phase relationships of FIG. 8 along a single horizontal axis.

DESCRIPTION OF THE PREFERRED EMBODIMENT

I. Introduction

The circuit architecture contemplated by the present invention will hereinafter be referred to as an array oscillator circuit, and such a term is believed to be new to the art. As is described in detail below, the inventive array oscillator circuit includes a set of mutually coupled ring oscillators, each of which include an identical number of three-port buffer stages. By coupling selected buffer elements within two or more ring oscillators in a particular manner, each ring oscillator may be made to oscillate at an identical frequency but at a unique phase. In embodiments where the array oscillator is configured as a delay generator, the achievable delay resolution may be enhanced by increasing the number of constituent ring oscillators within the array. The inventive array oscillator allows for improved phase resolution relative to conventional ring oscillators by operating in a mode of oscillation in which corresponding outputs from each constituent ring oscillator are offset in phase by less than the delay of an individual buffer stage.

II. Conceptual Overview of Array Oscillator Architecture

Figure 4:
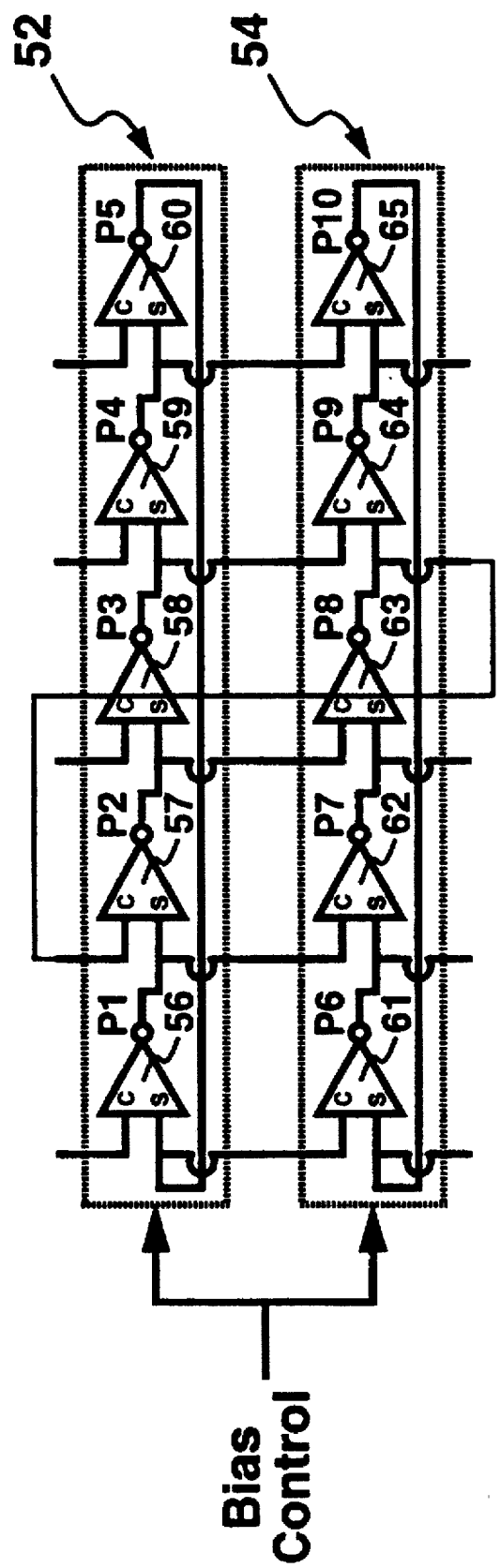
FIG. 4 shows a simplified block diagram representation of an array oscillator in accordance with the invention.

Turning now to FIG. 4, there is shown a simplified block diagram representation of an array oscillator 50 in accordance with the invention. The array oscillator 50 includes first and second ring oscillators 52 and 54 interconnected so as to form a closed circuit structure. The first and second ring oscillators 52 and 54 are seen to be respectively comprised of first and second sets of serially-connected differential-input inverting buffer stages 56–60 and 61–65. As is indicated by FIG. 4, the output of buffer stages 56–60 define the output signals at a first set of oscillator output ports P1–P5, while the buffer stages 61–65 define the output signals at a second set of oscillator output ports P6–P10. Although in the embodiment of FIG. 4 each buffer stage 56–65 provides a single-ended output, in other embodiments the buffer stages 56–65 are adapted to provide differential outputs. In such differential implementations the signal (S) and coupling (C) inputs of each buffer stage would each be disposed to receive a differential signal. A detailed description of a buffer stage capable of providing a differential output and having differentially-driven input signal (S) and coupling (C) ports is given below with reference to the schematic representation of FIG. 16.

Figure 1:
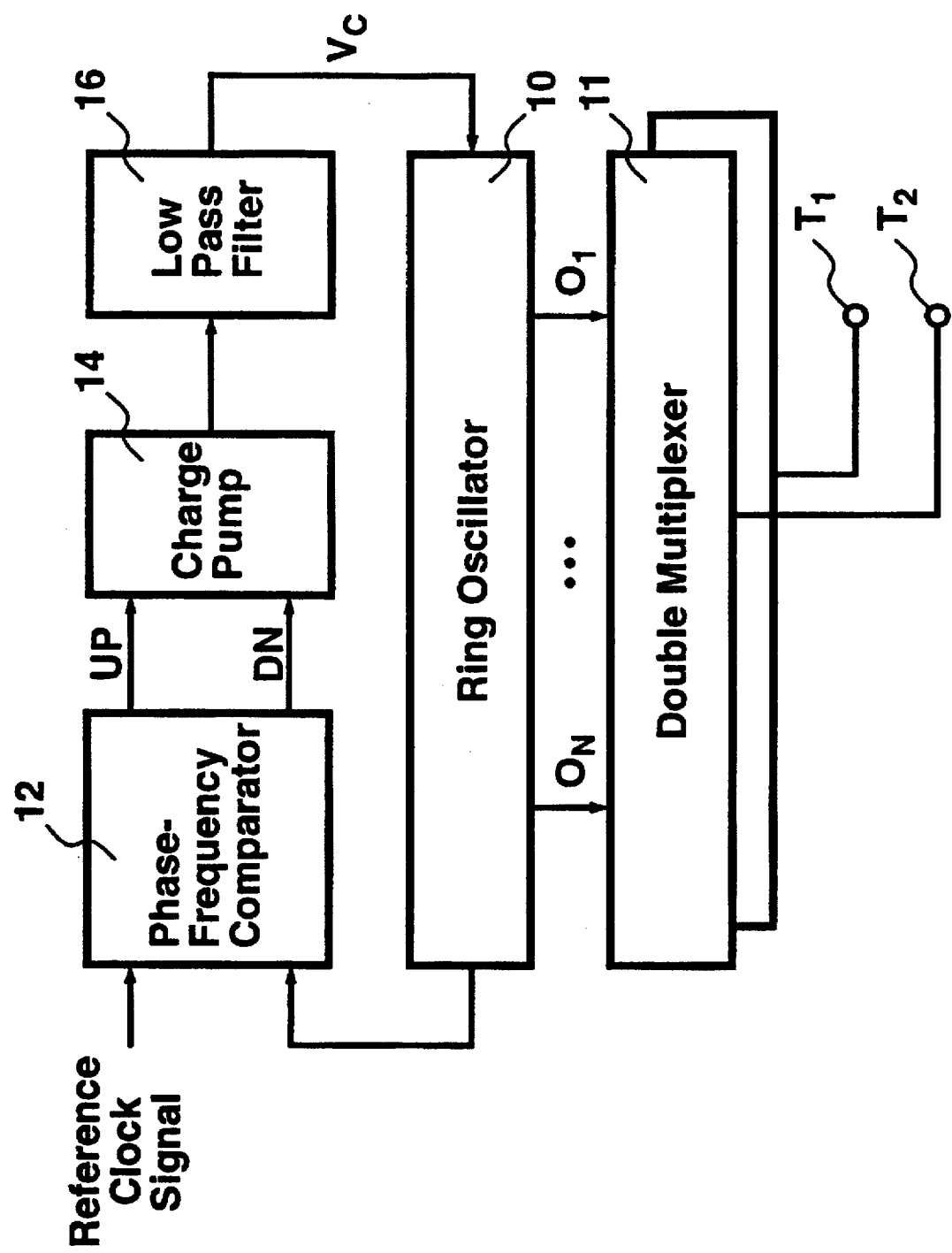
FIG. 1 shows a simplified block diagram of a phase locked loop operative to lock the frequency and phase of a reference clock signal to a conventional ring oscillator.

The buffer stages 56–65 are physically realized so as to possess substantially identical electrical characteristics, and all are commonly biased by an externally-supplied control voltage. Such a control voltage may be provided by, for example, a PLL circuit of the type shown in FIG. 1. The application of a common bias voltage results in an equivalent nominal signal delay through each buffer stage 56–65 (i.e., a nominal buffer delay), thereby causing the first and second ring oscillators 52 and 54 to oscillate at the same frequency. The term "nominal buffer delay" is employed since, as is described below, the buffer stages 56–65 are designed so that the signal delay through each is influenced not only by the externally-applied bias voltage, but also by the relative phase between the signals applied to the coupling (C) and signal (S) inputs of each buffer stage.

Figure 2:
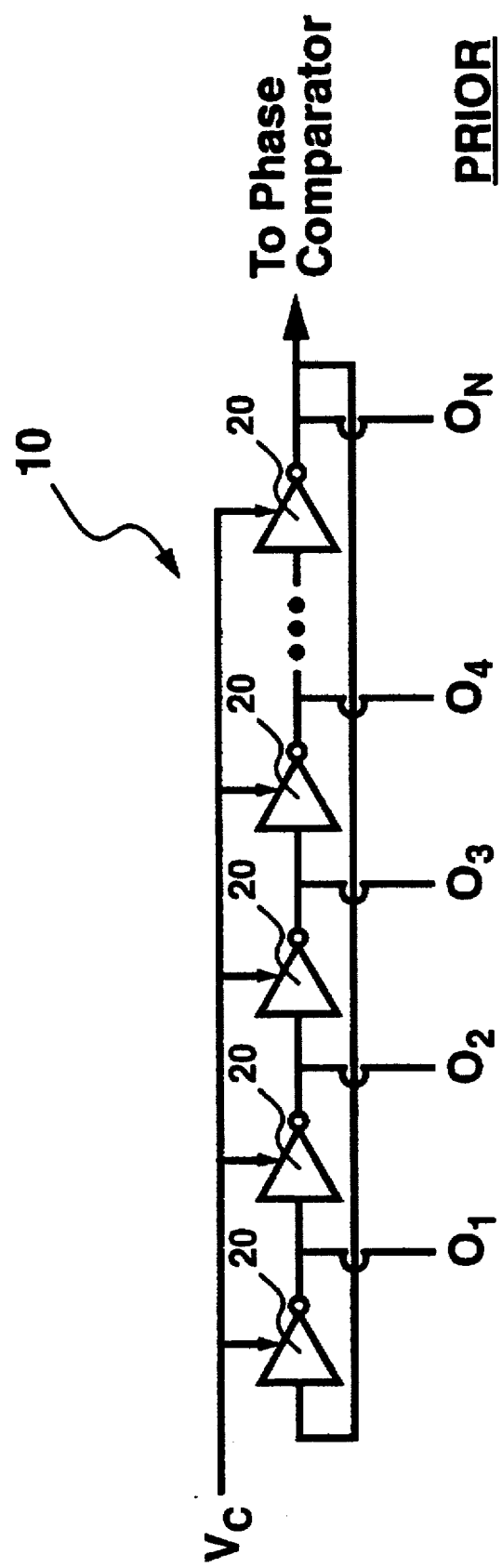
FIG. 2 depicts a conventional ring oscillator having a set of N serially-connected buffer inverters.

Although the first and second ring oscillators 52 and 54 share a common oscillation frequency, the novel design and interconnection of the differential-input buffer stages 56–65 forces a desired phase offset to appear between corresponding ones of the oscillator outputs P1–P5 and P6–P10. More specifically, during steady state oscillation the oscillator outputs P1 and P6 will not be at the same phase, but will be offset in phase by one nominal buffer delay. This offers improved phase resolution relative to conventional single-ended ring oscillators of the type shown in FIG. 2, which allow the achievement of phase resolution approximately equivalent to only two nominal buffer delays. The signal delay through various ones of the buffer stages 56–65 may be temporarily perturbed from the nominal buffer delay, in accordance with the phase of the differential signal received by the coupling (C) and signal (S) inputs, such that the desired phase offset is continued to be maintained. From the foregoing it is readily apparent that the inventive array oscillator 50 offers improved phase resolution relative to conventional ring oscillators, which, as noted in the Background of the Invention, are incapable of providing phase resolution of better than a single buffer delay. In the embodiment of FIG. 4 the output of each buffer stage within the second ring oscillator 54 is connected to the coupling input (C) of the buffer stage within the first ring oscillator 52 shifted to the left by two buffer stages. For example, the output P8 of buffer stage 63 is connected by a signal line (shown in phantom in FIG. 4) to the coupling input C1 of buffer stage 56. For clarity of presentation the remaining connections between the array outputs P9, P10, P6 and P7 and the coupling inputs C2, C3, C4 and C5, respectively, are not illustrated in FIG. 4. Similarly, the output of each buffer stage within the first ring oscillator is seen to be connected to the coupling input of a succeeding one of the buffer stages within the second ring oscillator 54.

It is to be understood, however, that in embodiments of the array oscillator containing more than two coupled ring oscillators the array may be closed by interconnecting the buffer stages in a manner other than that shown in FIG. 4. In alternate embodiments the coupling inputs of buffer stages within a given ring oscillator may be connected to the outputs of buffer stages within adjacent ring oscillators shifted by an arbitrary number of buffer stages. The manner in which the array oscillator is interconnected to form a closed circuit structure determines the relative phase relationship between corresponding outputs in adjacent ring oscillators. However, the minimum phase offset existing between a selected pair of array outputs, i.e., the phase resolution of the array, is equivalent to the phase delay of a single buffer stage divided by the number of ring oscillators within the array. Improved phase resolution may be achieved by augmenting the array oscillator with additional ring oscillators. In general, the phase resolution is improved from a conventional single ring oscillator by a factor proportional to the number of rings within the array.

III. Dual-Input Inverting Buffer Stage

Figure 5:
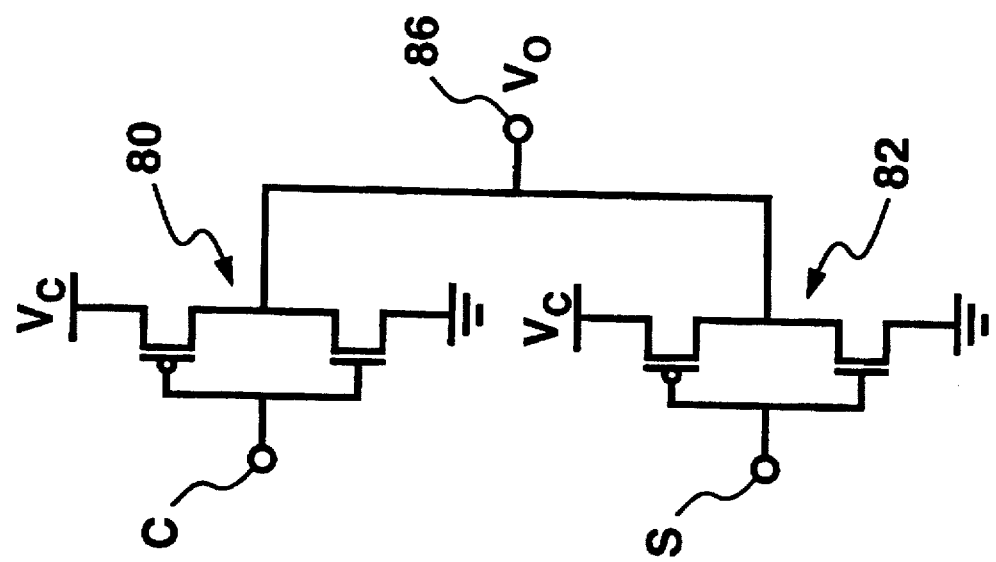
FIG. 5 provides a schematic representation of an exemplary CMOS implementation of a dual-input buffer stage.

In order to facilitate understanding of the operation of the inventive array oscillator, the structure of an exemplary CMOS implementation of a dual-input buffer stage will be briefly described with reference to the schematic diagram of FIG. 5. A more detailed description of a preferred realization of an exemplary buffer stage is provided below in section VI. Referring now to FIG. 5, the buffer stage includes a first CMOS inverter 80 having an input connected to the coupling input (C), and a second CMOS inverter 82 having an input connected to the signal port (S). The outputs of the inverters 82 and 84 are seen to be commonly connected to an output terminal 86 of the buffer stage. The CMOS inverters are identically biased by the control voltage externally supplied to the array oscillator. In accordance with a preferred embodiment of the array oscillator, the constituent ring oscillators are connected such that transitions in the signals applied to the coupling (C) and signal (S) ports will at least partially overlap in time. This results in the signal transitions at both the coupling (C) and signal (S) inputs having an effect upon the timing of the signal transition at the buffer stage output terminal 86.

In particular, if the coupling input transition exactly coincides with the signal input transition, then the transitions at the signal input (S) and buffer output 86 are separated by a signal delay equivalent to a nominal buffer delay. When the coupling input transition precedes the signal input transition, the resultant signal delay through the buffer stage from the signal input (S) to the buffer output 86 is less than a nominal buffer delay. Similarly, a coupling input transition occurring later than a signal input causes the resultant signal delay to exceed a nominal buffer delay. This operational characteristic of the buffer stages enables a precise phase relationship to be established between the oscillations within the ring oscillators interconnected within the array.

Figure 6:
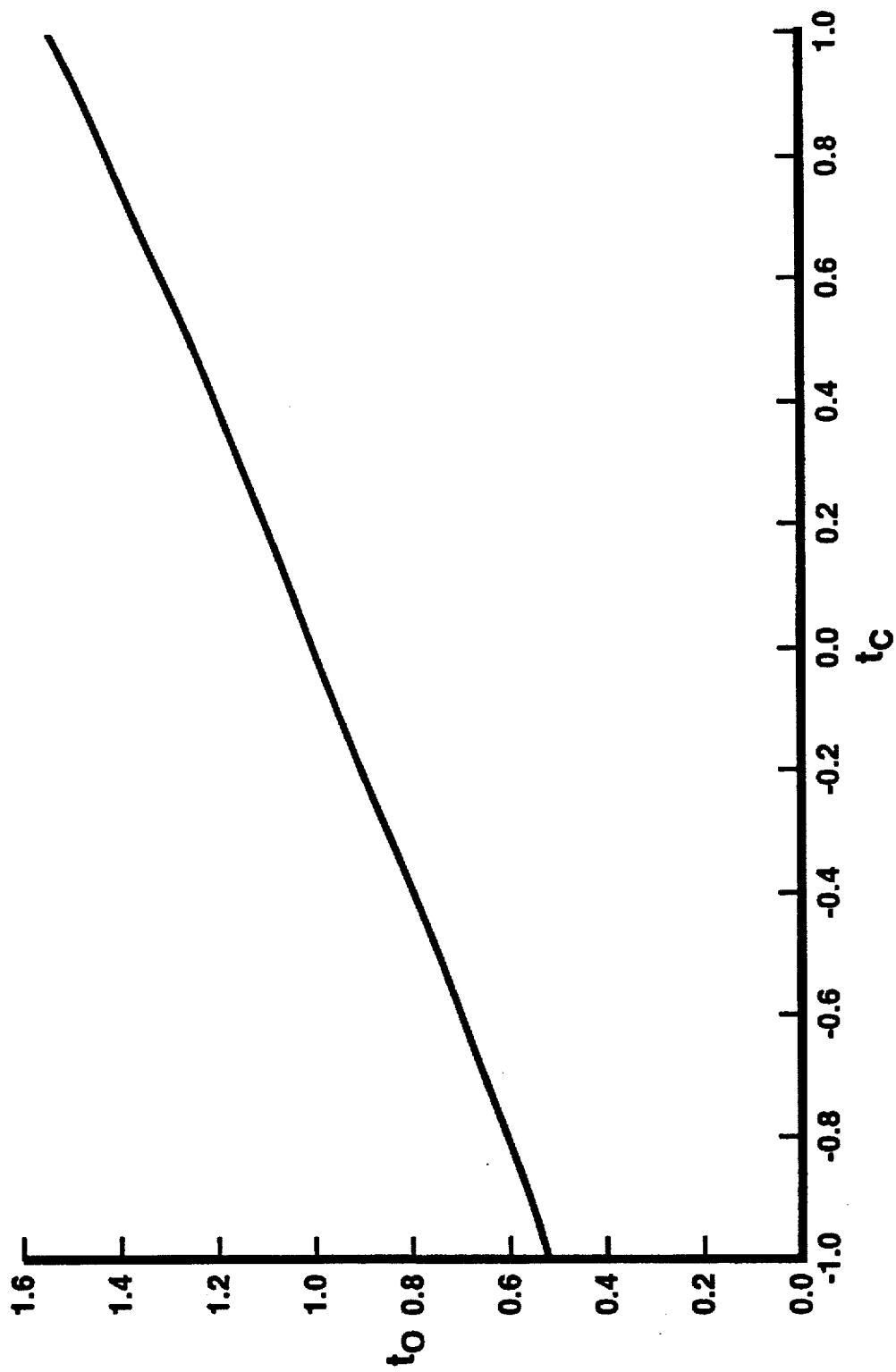
FIG. 6 graphically represents the desired monotonic effect of a relative coupling input delay ($t_c$) upon a normalized buffer stage delay ($t_0$).

FIG. 6 graphically represents the desired monotonic effect of the relative coupling input delay ($t_c$) {i.e., the phase delay between the coupling input (C) input and the signal input (S)}, upon the normalized buffer stage delay ($t_0$). That is, a the coupling input delay ($t_c$) is normalized to the case of simultaneous signal transitions at the coupling and signal inputs ($t_c=0$), while the buffer stage delay is normalized to a nominal buffer delay ($t_0=1$). As an example, a coupling input delay of $t_c=0$ results in a signal delay through the buffer stage equivalent to a nominal buffer delay ($t_0=1$). In like manner a coupling input delay of $t_c=1$ (i.e, the signal transition at the coupling input is delayed by an interval equivalent to a nominal buffer delay relative to the signal input transition) results in a normalized buffer delay of $t_0=1.5$. As is apparent from FIG. 6, a monotonic relationship exists between the relative coupling input delay ($t_c$) and the resultant normalized buffer delay ($t_0$). Such monotonicity, although perhaps nonlinear, is required to ensure the existence of appropriate coupling dynamics within the array.

IV. Operation of the Array Oscillator

The operation of the array oscillator of the invention may be conveniently described with reference to the idealized infinite array oscillator 90 of FIG. 7. The oscillator structure of FIG. 7 includes an infinite array of mutually coupled ring oscillators R (hereinafter "rings R"), each of which include a set of N serially-connected dual-input buffer stages 92 of the type described above in section III. Suppose, for example, that the rings R are oscillating in phase. In this situation the signal transitions at the coupling and signal inputs will be precisely in phase, thereby resulting in a nominal buffer delay through each buffer stage. Since each ring R is oscillating at the same frequency and the signal and coupling input transitions are locked in phase, the output transitions produced by corresponding buffer stages within each ring R will also be exactly aligned in phase. In this mode of operation the minimum achievable delay resolution between any pair of buffer stage outputs is equivalent to a nominal buffer stage delay.

Improved delay resolution is obtained in the case where an identical fixed phase difference is introduced between the signal (S) and coupling (C) inputs of each buffer stage. Under this condition the identical delay through each buffer stage will differ from the nominal buffer delay because of the phase offset between the signal and coupling inputs. With equal buffer delays, the oscillation frequency of each ring R will also be identical. Accordingly, the phase difference between the signal transitions at the signal and coupling inputs will remain invariant over time, again leading to a consistent state of oscillation. However, in this state of oscillation the phase at the outputs of adjacent rings R are offset in phase by a fixed delay, thereby allowing the existence of phase delays of less than a nominal buffer stage delay between selected pairs of buffer stage outputs.

Figure 7:
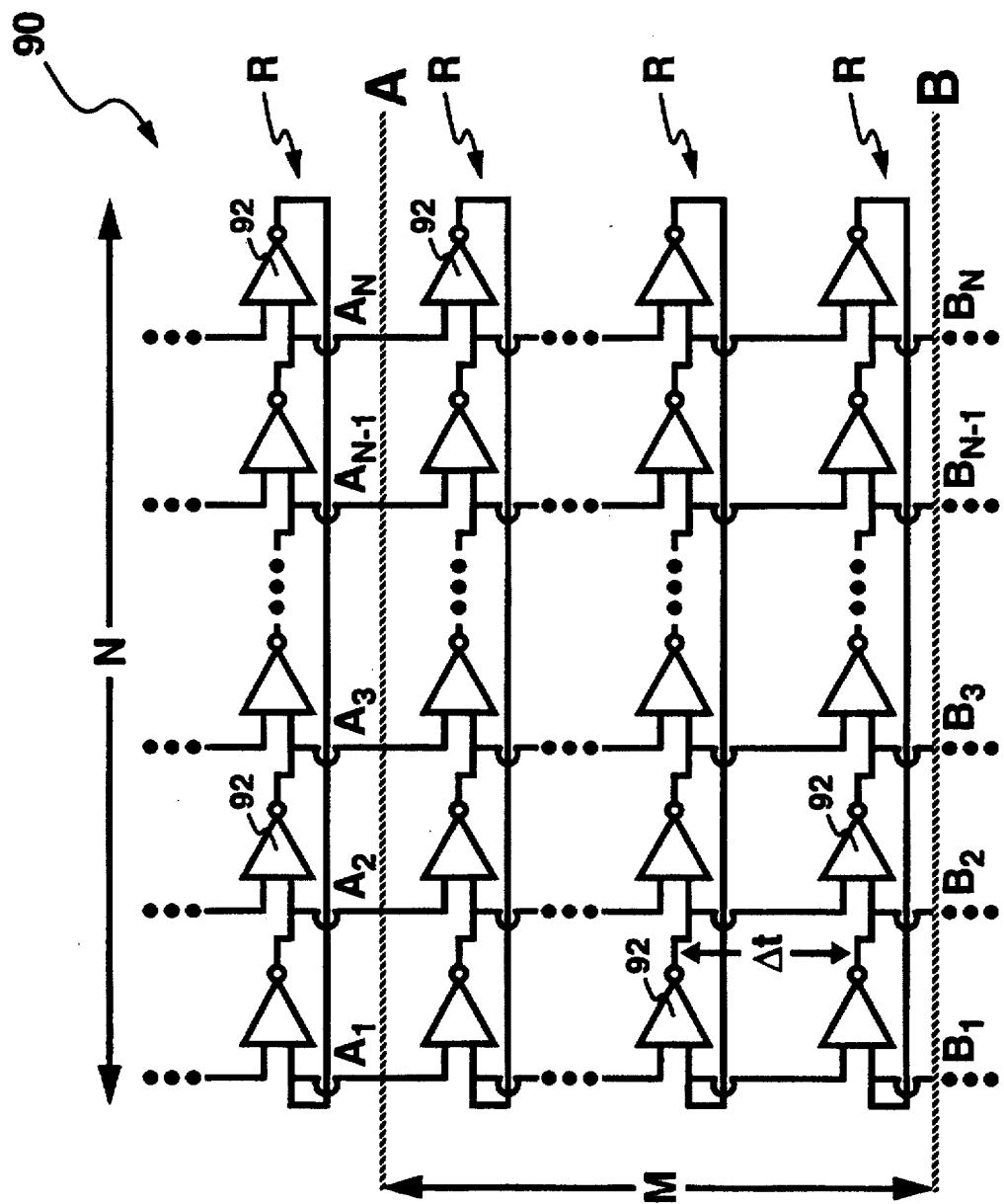
FIG. 7 depicts an idealized infinite array oscillator structure.

Referring to FIG. 7, it is possible that the phase of each coupling input $A_i$, i=1 to N, intersected by the dashed line A could identically match the phase of a shifted one of the buffer stage outputs intersected by the dashed line $B_i$, i=1 to N. For example, assume that each coupling input $A_i$ is locked in phase with the corresponding output $B_{i+2}$. This situation may be induced by forming a closed array oscillator in which the coupling inputs $A_i$ are connected to the buffer outputs $B_{i+2}$. It is noted that in this case buffer output $A_N$ would be connected to buffer output $B_2$, buffer output $A_{N-1}$ would be connected to buffer output $B_1$, buffer output $A_{N-2}$ would be connected to buffer output $B_N$, and so on. Closing the array oscillator with such a non-zero buffer shift forces a phase difference to exist between the interconnected buffer output stages at the top and bottom boundaries of the closed array. As a consequence of the symmetry of the resulting array, the phase shift set at the array boundary will be uniformly subdivided as phase offsets between adjacent rings R.

FIG. 8 illustratively represents the phase relationship existing among the buffer stage outputs for an array oscillator containing seven rings $R_i$, i=1 to 7, each of which include five buffer stages, for the case where a phase shift of two buffer delays is imposed at the array boundary. That is, the array is configured such that the buffer outputs $B_i$ in the seventh (i.e., bottom) ring oscillator $R_7$ are connected to the coupling inputs of the buffer stages $A_{i-2}$ in the first (i.e., top) ring oscillator $R_1$.

Each row of FIG. 8 represents the phase changes which occur at the outputs of the five buffer stages within a given ring R over a single oscillation period. The oscillation period of each ring R is equivalent to a buffer delay scaled by twice the number of buffer stages included therein. Phase changes corresponding to rising transitions are represented by filled circles, while falling transitions at a buffer output are represented by open circles. Referring, for example, to the seventh row of FIG. 8, the output of the first buffer stage within ring $R_7$ is seen to experience a rising transition at the start of a given oscillation period. This rising transition at the output of the first buffer stage in ring $R_7$ induces a falling transition to occur at the output of the second buffer stage of ring $R_7$ after a delay of D=0.1 oscillation periods following the beginning of the given oscillation period. In like manner a rising transition is forced to occur at the output of the third buffer stage after a relative delay of D=0.3 oscillation periods. As is indicated by FIG. 8, phase resolution of $D_{NOM}/7$, where $D_{NOM}$ denotes a nominal buffer delay, could be obtained with differential buffer stages by simultaneously coupling to the outputs of corresponding buffer stages within adjacent rings Ri. For example, if the outputs of the third buffer stages within rings $R_6$ and $R_7$ were tapped one would observe, at the instant in time corresponding to D=0.2, a pair of rising transitions separated by a delay equivalent to $2(D_{NOM})/7$.

Figure 3A:
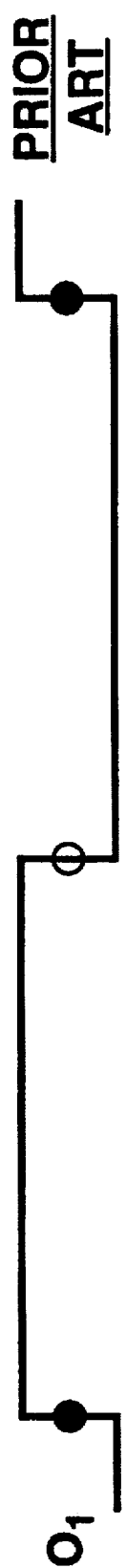
FIGS. 3A and 3B illustratively represent the steady state phase relationship existing among the oscillator outputs provided by an exemplary conventional ring oscillator.
Figure 3B:
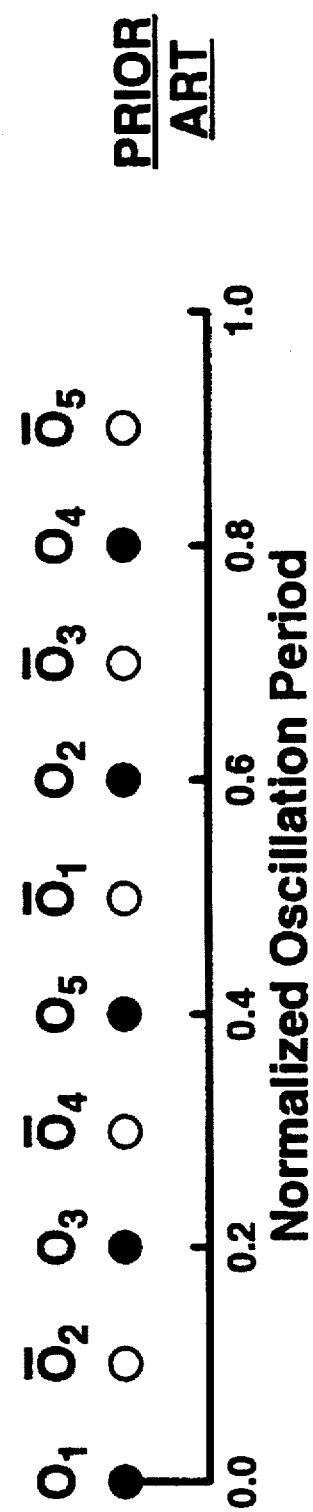

FIG. 9 illustratively represents the phase relationships of FIG. 8 along a single horizontal axis. A comparison of FIG. 3B and FIG. 9 makes apparent the significant improvement in phase resolution afforded by the array oscillator of the present invention.

The phase distribution represented by FIGS. 8 and 9 corresponds to an array structure formed by interconnecting the coupling inputs of the ring oscillator at the upper array boundary to corresponding buffer stage outputs within the ring oscillator at the lower array boundary "shifted to the right" by two buffer stages. In general, however, a closed array structure may be formed in accordance with the invention by interconnecting the rings R1 and $R_7$ such that a shift of an arbitrary number of buffer stages exists between the resulting coupled pairs of buffer stages.

Referring again to FIG. 7, assume that coupling inputs $A_i$ are connected to buffer stage outputs $B_{i-k}$, where k denotes the number of buffer stage delays existing between the resulting coupled pairs of buffer stages. Under this boundary condition the aggregate delay spanned by the outputs of corresponding buffer stages within each column of the resulting closed array oscillator is equivalent to k buffer stage delays. Because the oscillation signals within the array are periodic, the boundary conditions will be satisfied if the aggregate delay is equivalent to k buffer stage delays plus an integer multiple of the oscillation period. If it is again assumed that the closed array includes a set of M ring oscillators, each having N buffer stages (i.e., N ring nodes), and if it is further assumed that the array is phase locked to a reference clock signal of period T, then the delay D of each buffer stage may be expressed as D=T/2N. As is also indicated by FIG. 7, the signal delay between the corresponding nodes of adjacent rings R is represented by $\Delta t$. It follows that:

$$M\Delta t = kD + xT \qquad (1)$$

where kD represents the phase shift forced by the imposed boundary conditions, x is an integer representing the number of extra oscillation periods spanned by the outputs of corresponding buffer stages within each array column. From equation (1) the signal delay $\Delta t$ may be expressed as:

$$\Delta t = \frac{xT + k\frac{T}{2N}}{M} \qquad (2)$$

so that $$\frac{\Delta t}{T} = \frac{C}{2NM} \qquad (3)$$

where $$C = k + x2N \qquad (4)$$

The parameter C represents an array coupling factor, or, equivalently, an array mode of oscillation. As is indicated by equation (4), the parameter C specifies the number of buffer stage delays spanned by the ring nodes comprising each array column. It is thus apparent that for each value of x the array will oscillate in a mode defined by a unique coupling factor C. It is noted that the quantity $\Delta t/T$ will not necessarily be indicative of the minimum achievable delay resolution, where, again, $\Delta t$ denotes the phase delay between successive nodes within a given array column. Specifically, in certain operative modes the desired minimum delay resolution will be obtained by tapping a pair of array nodes from different array columns as a consequence of the variation, with respect to mode of oscillation, of the ordering of array output phases.

In a each embodiment the change in buffer stage delay resulting from changes in coupling factor C results in modification of the oscillation frequency of the array. Assuming that a small input phase offset exists between the signal and coupling input transitions of each buffer stage, a linear model may be employed to approximately represent the effect of the input phase offset upon buffer stage delay. In particular, for coupling and signal inputs received by buffer stage transistors of equal dimension, the resulting buffer delay will be equivalent a nominal buffer stage delay (i.e., simultaneous signal and coupling input transitions) less one-half of the time interval by which the coupling input transition precedes the signal input transition. Thus, $$D(C) = D(0) - \frac{1}{2} \Delta t(C) = D(0) - \frac{1}{2} D(C) \frac{M}{N} \quad (5)$$

so that $$D(C) = \frac{D(0)}{1 + \frac{1}{2}\frac{C}{M}} \quad (6)$$

where D(C) denotes the buffer stage delay (i.e., between the buffer stage signal input and the buffer stage output) as a function of the coupling factor C. The period of oscillation T(C) of each ring R within the array oscillator, as a function of coupling factor C, is equivalent to 2ND(C).

In particular operative modes the achievable phase resolution will not be equivalent to the delay of a buffer stage delay divided by the number of rings R within the array oscillator, since certain pairs of the array output nodes (i.e., buffer stage outputs) will become locked in phase. More specifically, if the number of rings R and the coupling factor C share common factors, each array column will contain output nodes offset in phase by an integer number of buffer stage delays. Since the nodes within a given array column associated with adjacent rings R are offset in phase by a single buffer delay, certain nodes within each array column will be locked in phase with nodes in other columns. The number of unique phases provided by the differential nodes of the array oscillator may be expressed as:

$$\frac{2NM}{GCD(C,M)} \quad (7)$$

The array may be reset into a desired operative mode by initializing the phase relationship among the array nodes to be approximately equivalent to that existing during steady state oscillation in the desired mode. For a desired operative mode corresponding to a coupling factor C, the "closest" pair of neighboring modes are C−2N and C+2N, where, again, N denotes the number of buffer stages within each ring R. Accordingly, it is necessary that the fractional delay Δt/T satisfy the inequality $$\frac{C-N}{2NM} < \frac{\Delta t}{T} < \frac{C+N}{2NM} \quad (8)$$

in order that the array be reset into the desired mode following initialization. Briefly, the array may be initialized by disconnecting certain circuit elements of the buffer stages included within selected ones of the rings R from the bias voltage. By "open-circuiting" the array in this fashion oscillation at a fundamental mode is induced within the remaining rings R of the array. When the array is again closed, the array will begin to oscillate at the mode closest to the fundamental mode, i.e., the mode producing the highest oscillation frequency. A more complete description of the array initialization procedure is given below section VII with reference to a specific circuit implementation of the array buffer stages.

Figure 10:
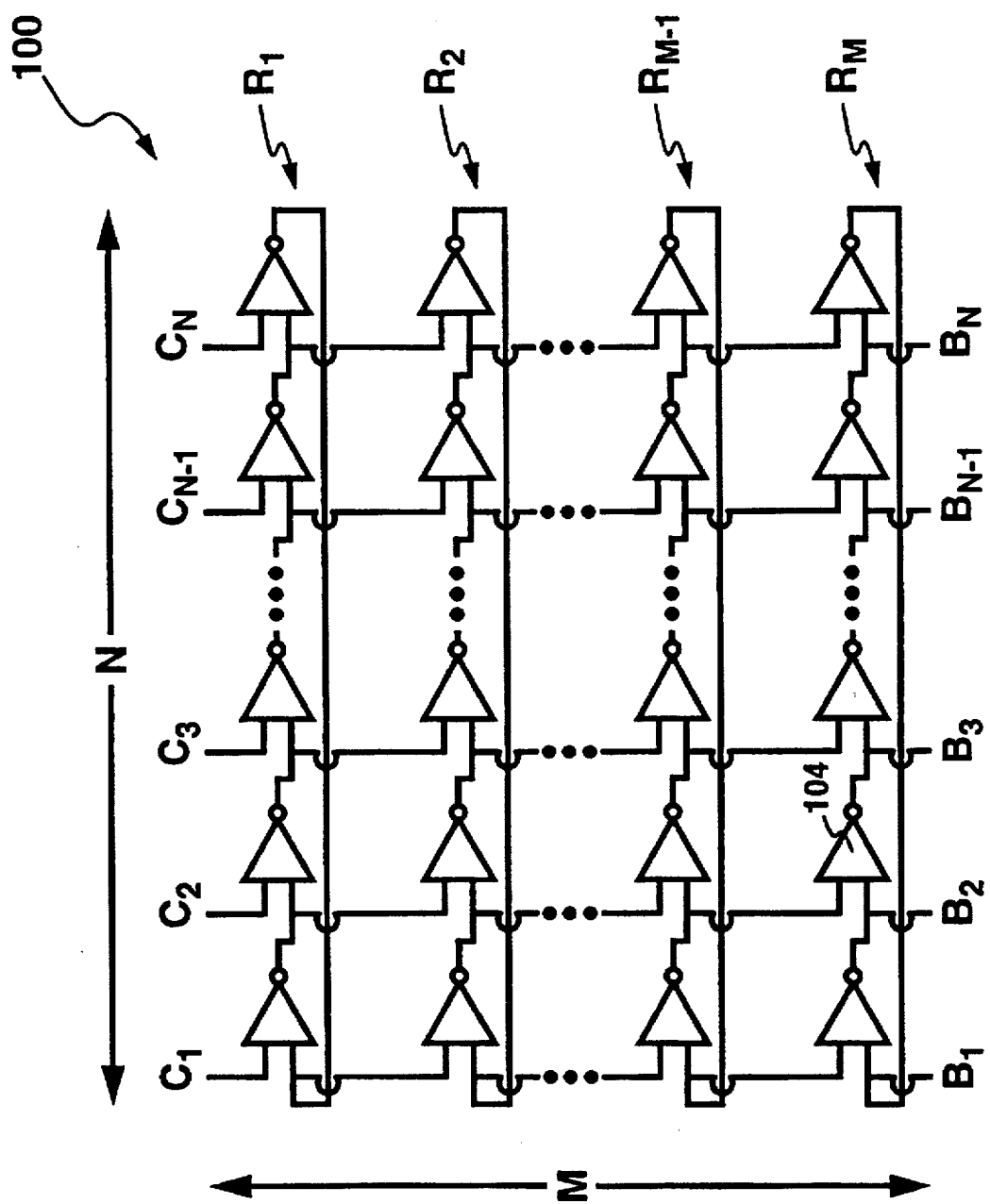
FIG. 10 shows a block diagrammatic representation of an M×N array oscillator in accordance with the invention.

Referring to FIG. 10, there is shown a block diagrammatic representation of an M×N array oscillator 100 in accordance with the invention. The array oscillator 100 includes a set of coupled rings $R'_i$, i=1 to M, each of which include N serially-connected differential input buffer stages 104. The desired boundary conditions are imposed upon the array oscillator 100 by connecting each of the buffer stage outputs $B'_i$, i=1 to N, of the ring $R'_M$ to a selected one of the coupling inputs $C'_i$, i=1 to N, of the buffer stages 104 within the first ring $R_1$. For example, a particular operative mode is excited within the array oscillator 100 by connecting each buffer stage output $B'_i$ to the coupling input $C_{i-2}$. In order to maintain the phase relationships necessary for oscillation within the array 100 an equivalent signal delay must exist through all array interconnections.

V. Output Channel Network

Figure 11:
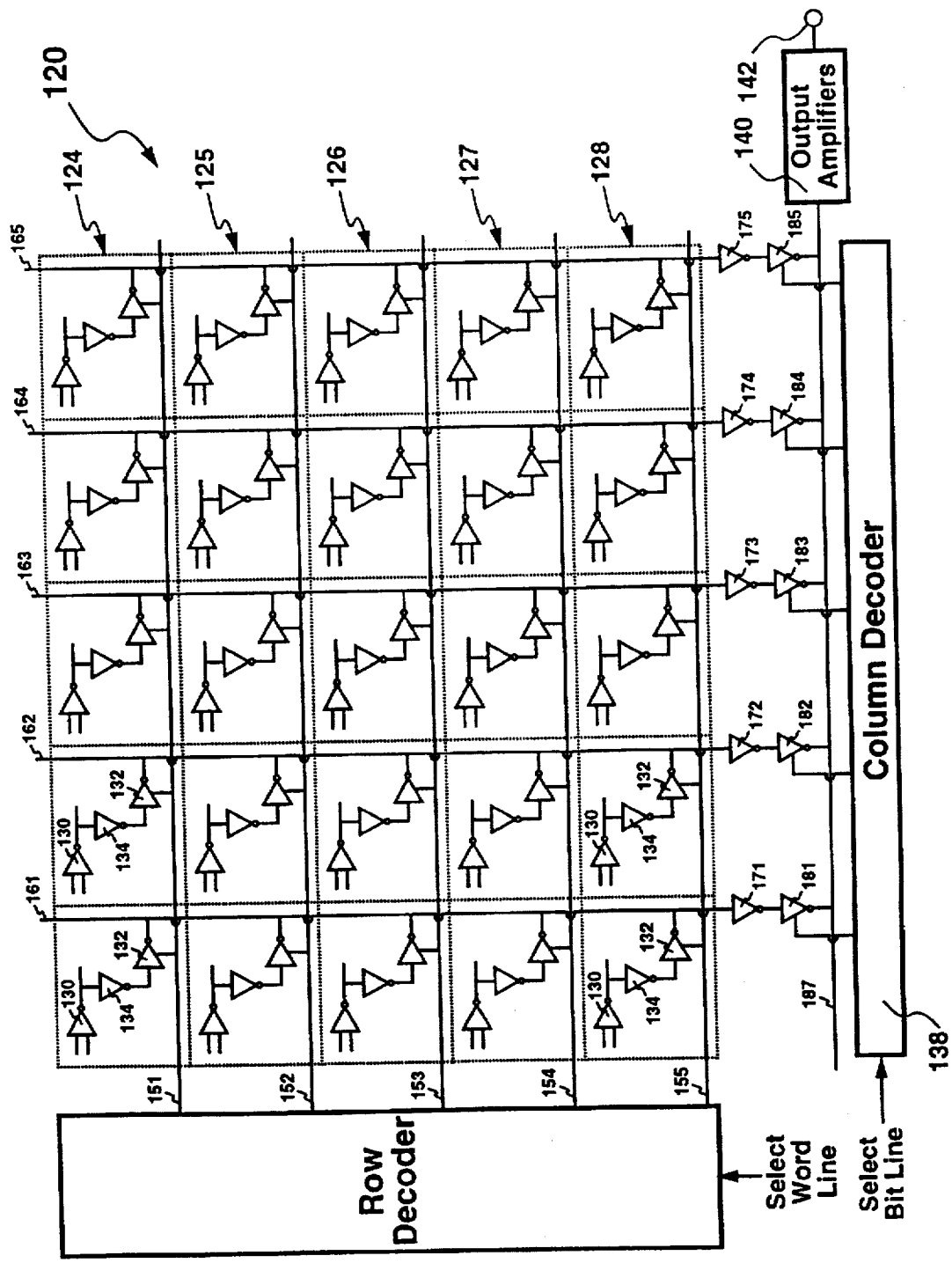
FIG. 11 depicts an array oscillator of the invention in which is incorporated an output channel network.

As is described below with reference to FIG. 11, the array oscillator of the invention may be utilized as a delay generator by accessing output signals from selected array nodes via a signal output channel network. Turning now to FIG. 11, there is illustratively represented an array oscillator 120 comprised of a 5×5 array of buffer cells 124–128. In the embodiment of FIG. 11 the buffer cells within each column of the array function as a ring oscillator, and hence one of the buffer cells 124–128 from each row of the array is included within each of the five vertically-oriented ring oscillators. As is described in further detail below, each buffer cell 124–128 includes a buffer stage 130 of the type described above with reference to FIG. 5, a column multiplexer 132, and an isolation buffer 134. The column multiplexer 132 and isolation buffer 134 within a given buffer cell 124–125 allow the signal produced at the internal array node of the cell by the buffer stage 130 thereof to be accessed by an output channel network. The connections between the buffer cells within each vertical ring oscillator, as well as the horizontal connections existing between the ring oscillators of adjacent columns, have been omitted for clarity of presentation.

In accordance with the invention, a signal output channel network is provided which includes a row decoder 136, a column decoder 138 and an output amplifier 140. The output channel operates to impress the signal produced at the internal array node of a selected buffer cell 124–128 upon an output terminal 142. Since to be of utility the phase of the signal impressed on output terminal 142 will generally be required to be referenced to the phase of the signal at another node within the array, a reference channel output channel network will generally also be employed to couple the signal at a reference array node to a reference output terminal (not shown). The manner in which the buffer cells 124–128 may be configured so as to allow access by both reference and signal output channel networks is discussed below in connection with FIG. 13.

In response to a select word line instruction received from a controller (not shown), the row decoder 136 actuates one of five word lines 151–155 so as to enable the output buffers 132 within a single row of buffer cells. For example, if word line 151 is actuated then the output buffers 132 within the first row of buffer cells 124 become electrically connected to respective ones of the vertical bit lines 161–165. The isolation buffers 134 within each buffer cell isolate each buffer stage 130 from the output buffers 132 so as to prevent variation in the loading of each array node. That is, the isolation buffers 134 serve to maintain a constant loading at the array output nodes despite selective enablement of the output buffers 132. The signals upon each bit line 161–165 are amplified by buffer amplifiers 171–175, and are passed to multiplexing buffers 181–185. One of the multiplexing buffers 181–185 is then actuated by the column decoder 138 in response to a select bit line instruction received from the controller. The signal produced by the selected array node is then impressed onto output line 187 and provided to output amplifier 140. The resultant phase changes at output node 142 may then be compared with the phase changes at a reference node (not shown) to obtain the selected signal delay.

Figure 12:
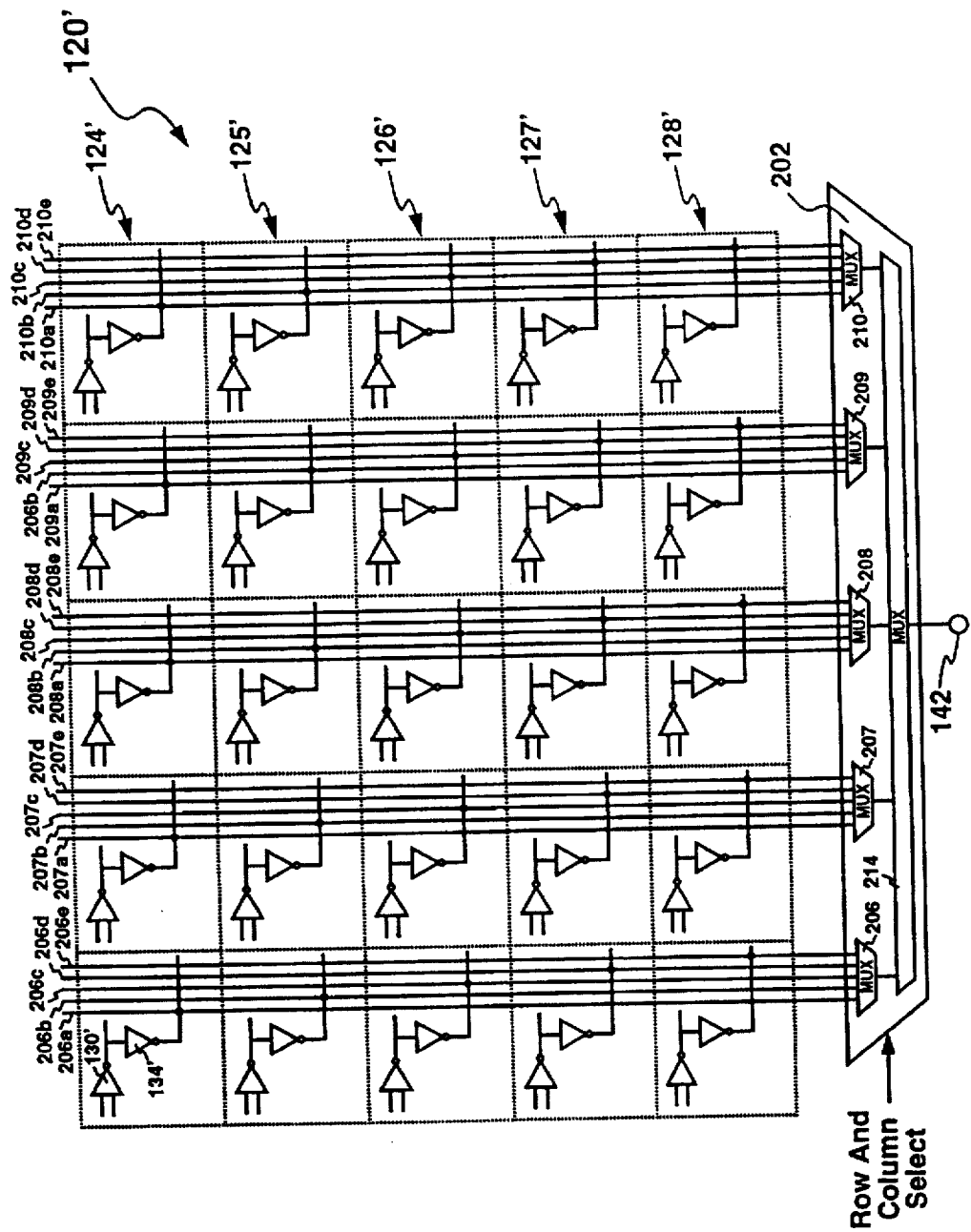
FIG. 12 shows an array oscillator configured with an alternate implementation of the output channel network.

Referring now to FIG. 12, there is shown an array oscillator 200 configured with an alternate implementation of the output channel network. In the embodiment of the array oscillator 200 the signal output channel network is seen to include a decoding network 202 having five column multiplexers 206–210 and an output multiplexer 214. The decoding network 200 operates to impress the signal produced at the internal array node of a selected buffer cell 124'–128' upon an output terminal 220. The buffer cells 124'–128' are substantially similar to the buffer cells 124–128 in that each includes a differential-input buffer stage 130' and an isolation buffer 134'. However, the isolation buffers 134 within a given array column (i.e., within a given ring oscillator) are each directly coupled to one of five bit lines addressing the given column. For example, the isolation buffers 134' within the first column are each coupled to one of the five bit lines 206a–206e connected to the column multiplexer 206. If the row select signal supplied from the controller (not shown) indicates that the first row of buffer cells 124' is to be selected, then the column multiplexers couple the bit lines 206a–210a to the output multiplexer 214. Similarly, in response to row select signals indicating that the second 125', third 126', fourth 127' or fifth 128' rows are to be selected, either the bit lines 206b–210b, 206c–210c, 206d–210d or 206e–210e are electrically connected to the output multiplexer 214 by the column multiplexers 206–210. In response to a column select signal the multiplexer 214 couples a selected one of the of the outputs of the multiplexers 206–210 to the output terminal 220. Again, the resultant phase changes at output node 220 may then be compared with the phase changes at a reference node (not shown) to obtain the selected signal delay.

VI. Differential-Output Buffer Cell

Figure 13:
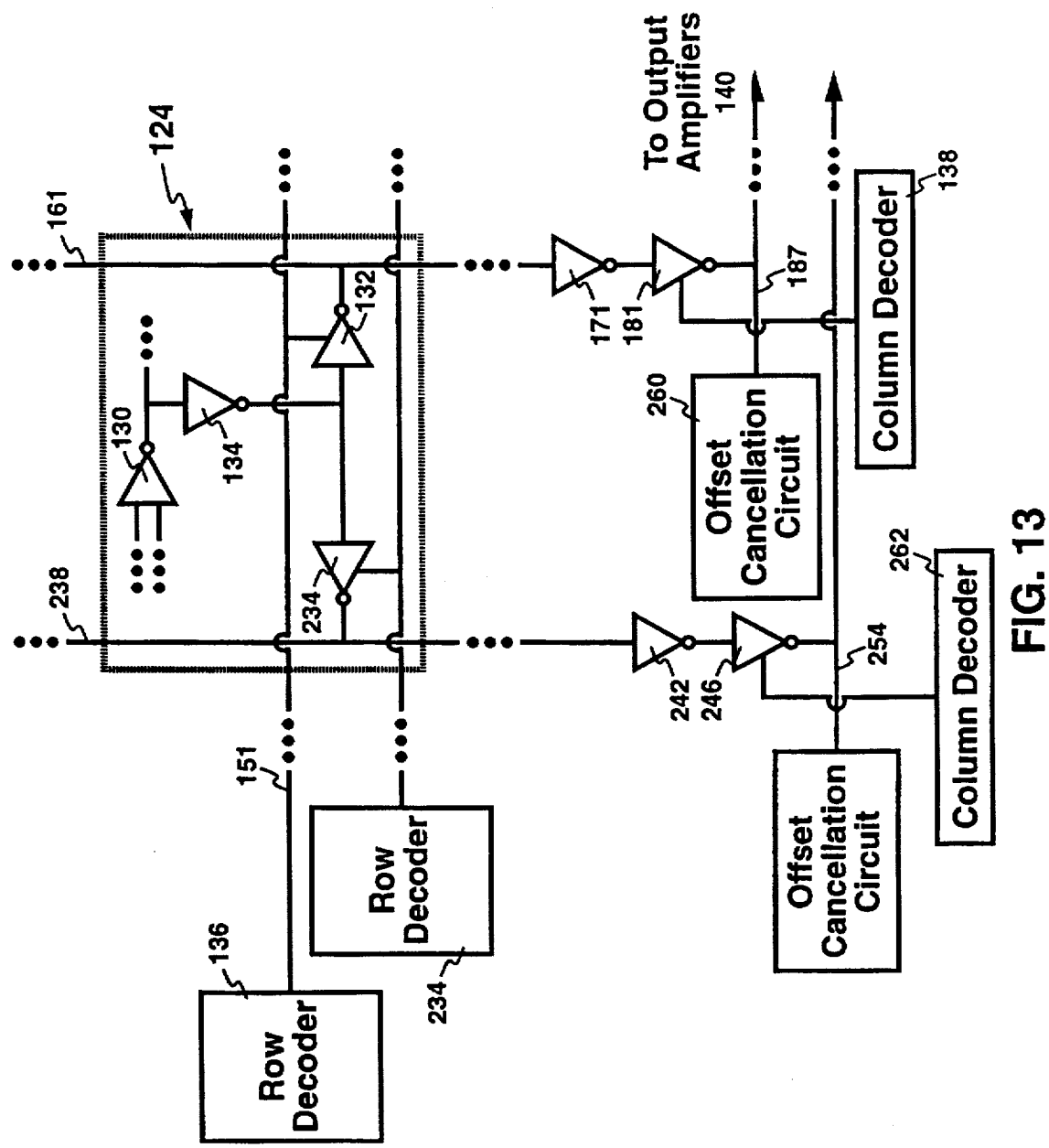
FIG. 13 depicts a buffer cell of the array oscillator of FIG. 11 as implemented to provide a signal to a signal and/or to a reference output channel network.

FIG. 13 depicts the buffer cell 124 located in the first row and first column of the array 120 (FIG. 11), as implemented to provide a signal to the signal output network or to a reference output channel network. In particular, the buffer cell includes a reference output buffer 230 for, when enabled by reference row decoder 234 of the reference output channel network, impressing the output of buffer stage 130 upon a first reference bit line 238. The signal impressed upon the first reference bit line 238 is amplified by a buffer amplifier 242, and is passed to a multiplexing buffer 246. If the multiplexing buffer 246 is then actuated by a reference column decoder 250, the signal produced by the selected buffer cell 124 is multiplexed onto reference output line 254 and provided to a reference amplifier. The output of the reference amplifier may then be compared with the signal at output terminal 142 (FIG. 11) in order to obtain a pair of-signals offset in phase to the desired extent. It is understood that each of the buffer cells 124–128 may be configured as illustrated in FIG. 13, thereby allowing the signals at any pair of array nodes to be coupled to the reference output and to the output terminal 142. In the preferred embodiment the reference output channel network and the signal output channel network are implemented to provide identical signal delay between any pair of array nodes and the respective channel outputs.

In the embodiment of FIG. 13 the isolation buffer 134 isolates the buffer stage 130 from both the output buffer 132 and from a reference channel output buffer 230. As was discussed with reference to FIG. 11, in response to a select word line instruction received from a controller (not shown), the row decoder 136 actuates word line 151 so as to electrically connect output buffer 132 to column bit line 161. The signal impressed upon the bit line 161 is amplified by a buffer amplifier 171, and is passed to a multiplexing buffer 181. If the multiplexing buffer 181 is then actuated by the column decoder 138, the signal produced by the selected buffer cell 124 is multiplexed onto output line 187 and provided to output amplifier 140.

As is indicated by FIG. 13, differential offset cancellation circuits 260 and 262 are coupled to the output lines 187 and 254, respectively. The circuits 260 and 262 are designed to prevent address-dependent differential-mode phase offsets from being introduced by the signal and reference output channel networks. Cancellation of any such phase offsets by the circuits 260 and 262 prevents undesired duty cycle variation from developing in the signals produced by each output channel network.

Figure 14:
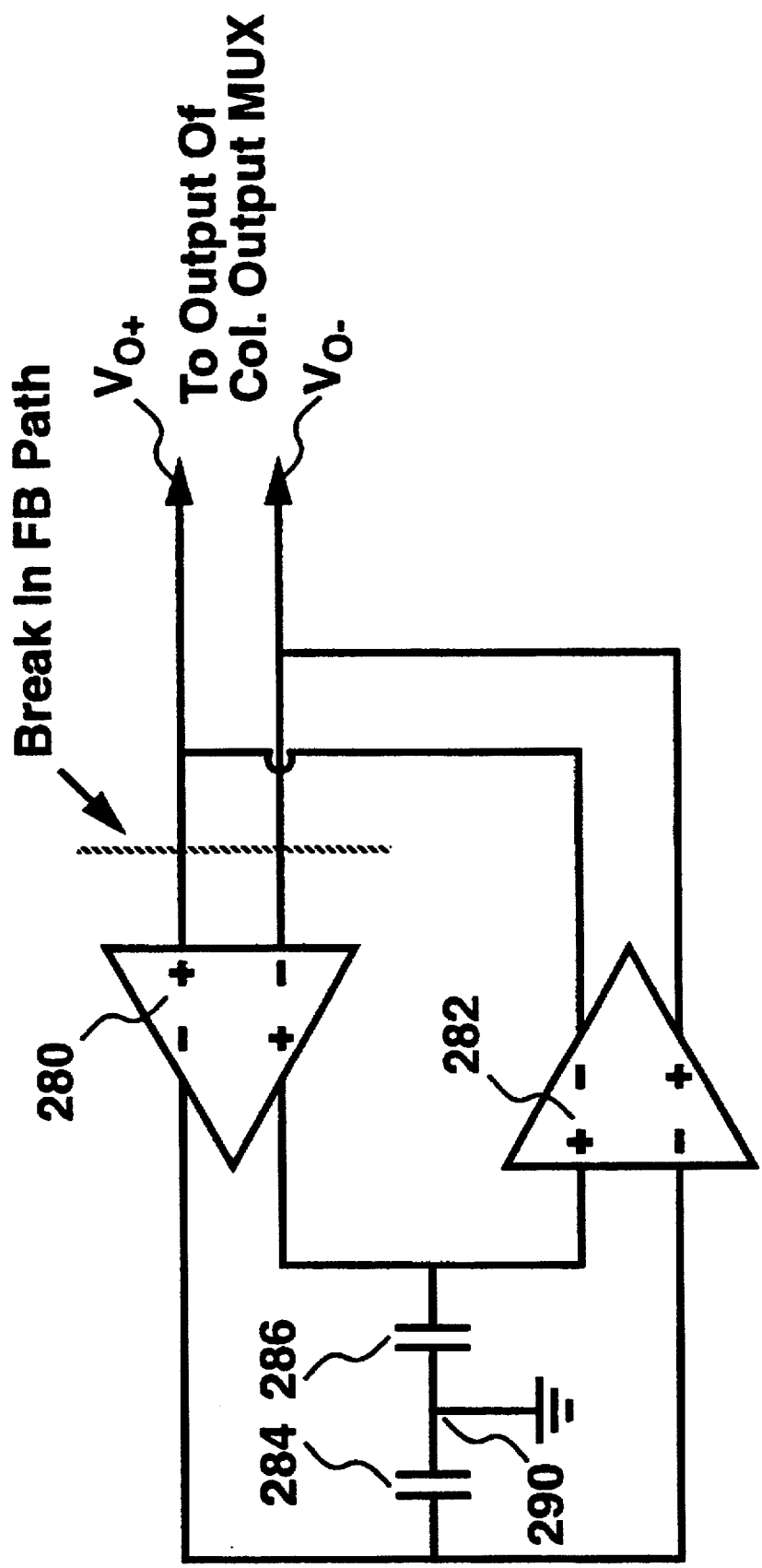
FIG. 14 is a block diagram representation of a differential offset cancellation circuit.

FIG. 14 is a block diagram representation of the differential offset cancellation circuit 260, it being understood that the circuit 262 is substantially identical thereto. The cancellation circuit 260 includes first and second differential-input feedback buffers 280 and 282. The complementary (+) and (−) outputs of the first feedback buffer are seen to be connected to the differential input of the second feedback buffer 282. Serially-connected capacitors 284 and 286 span the differential input of the second feedback buffer 282, with the voltage at node 290 being held fixed. The capacitors 284 and 286 serve to remove the AC signal components and allow feedback only for the DC signal components. The feedback loop defined by the cancellation circuit is closed by connecting the complementary (+) and (−) outputs of the second feedback buffer 282 to the inverting (−) and non-inverting (+) inputs of the first feedback buffer 280. The output of the differential offset cancellation circuit 260 is provided at the output terminals $V_{o+}$ and $V_{o-}$.

The operation of the circuit 260 may be conveniently analyzed by considering the feedback loop defined thereby to be broken at the plane $P_0$. When the circuit 260 is divided in this manner only the outputs of the second feedback buffer 282 remain connected to the output terminals $V_{o+}$ and $V_{o-}$. Assuming the buffer 282 to be equal in size to the selected one of the column multiplexers 181–185, the offset at the output of the feedback buffer 282 will be approximately equivalent to one-half of the differential-mode offset engendered by the selected column multiplexer 181–185. When applied to the input of the first feedback buffer 280, the original differential-mode offset is reduced in magnitude by a cancellation factor proportional to the product of the gain of the buffers 280 and 282. Assuming the feedback path is again closed at the plane $P_0$, the resultant negative feedback will reduce the offset at the output of the selected multiplexer 181–185 by the cancellation factor.

Figure 15:
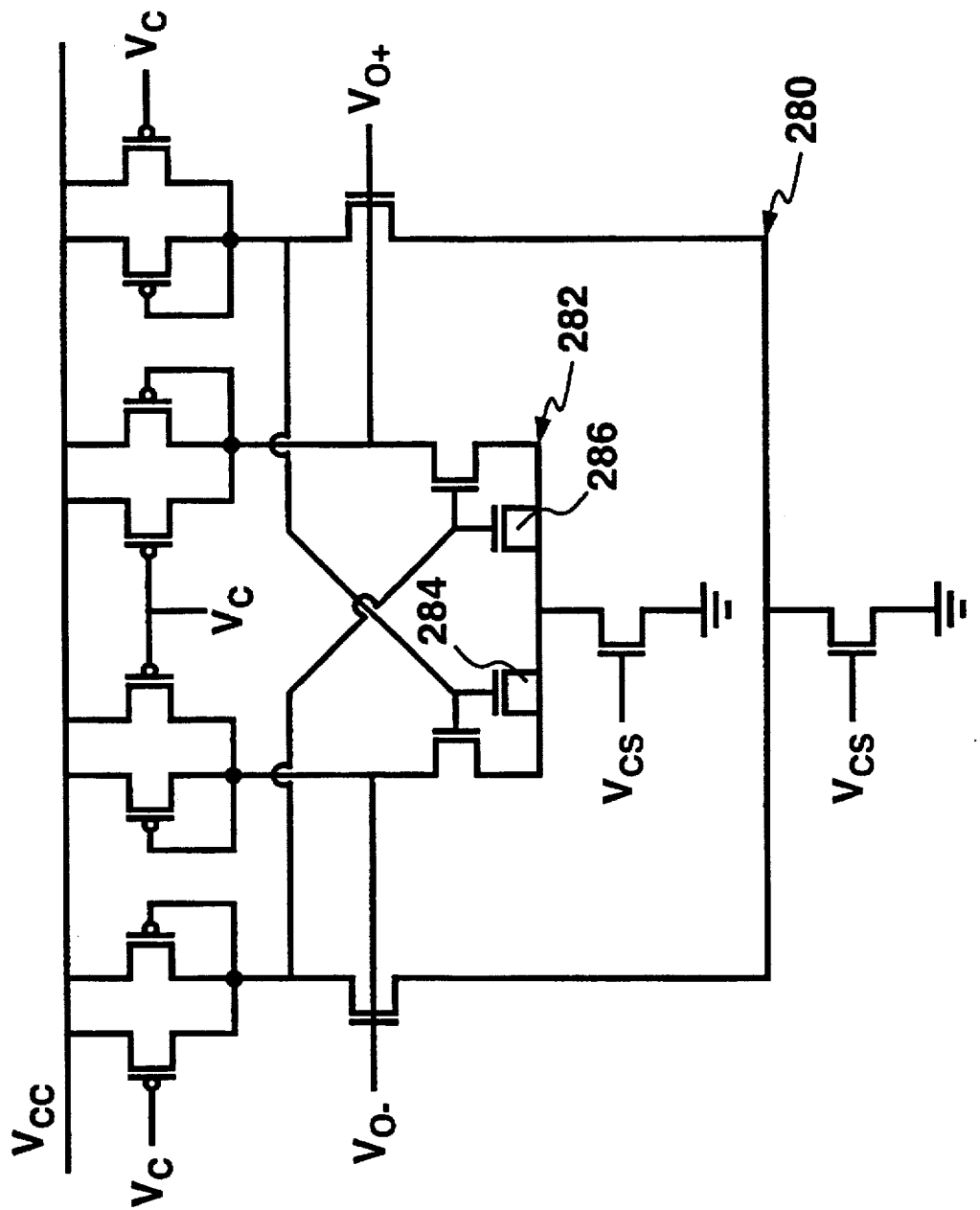
FIG. 15 shows a schematic diagram of a preferred implementation of the differential offset cancellation circuit of FIG. 14.

Turning now to FIG. 15, there is shown schematic diagram of a preferred implementation of the differential offset cancellation circuit 260, it being understood that the circuit 262 could be realized in a substantially identical manner. The first feedback buffer 280 is designed to be substantially identical to the differential-input buffers used as the array oscillator buffer stages (described below with reference to FIG. 16). The second feedback buffer 282 is seen to have input terminals coupled to the (+) and (−) outputs of the first feedback buffer 280. Each of the first and second feedback buffer 280 and 282 are biased by a current source responsive to a current-source gate control voltage $V_{CS}$.

VII. Differential-Mode Buffer Stage and Array Initialization

Figure 16:
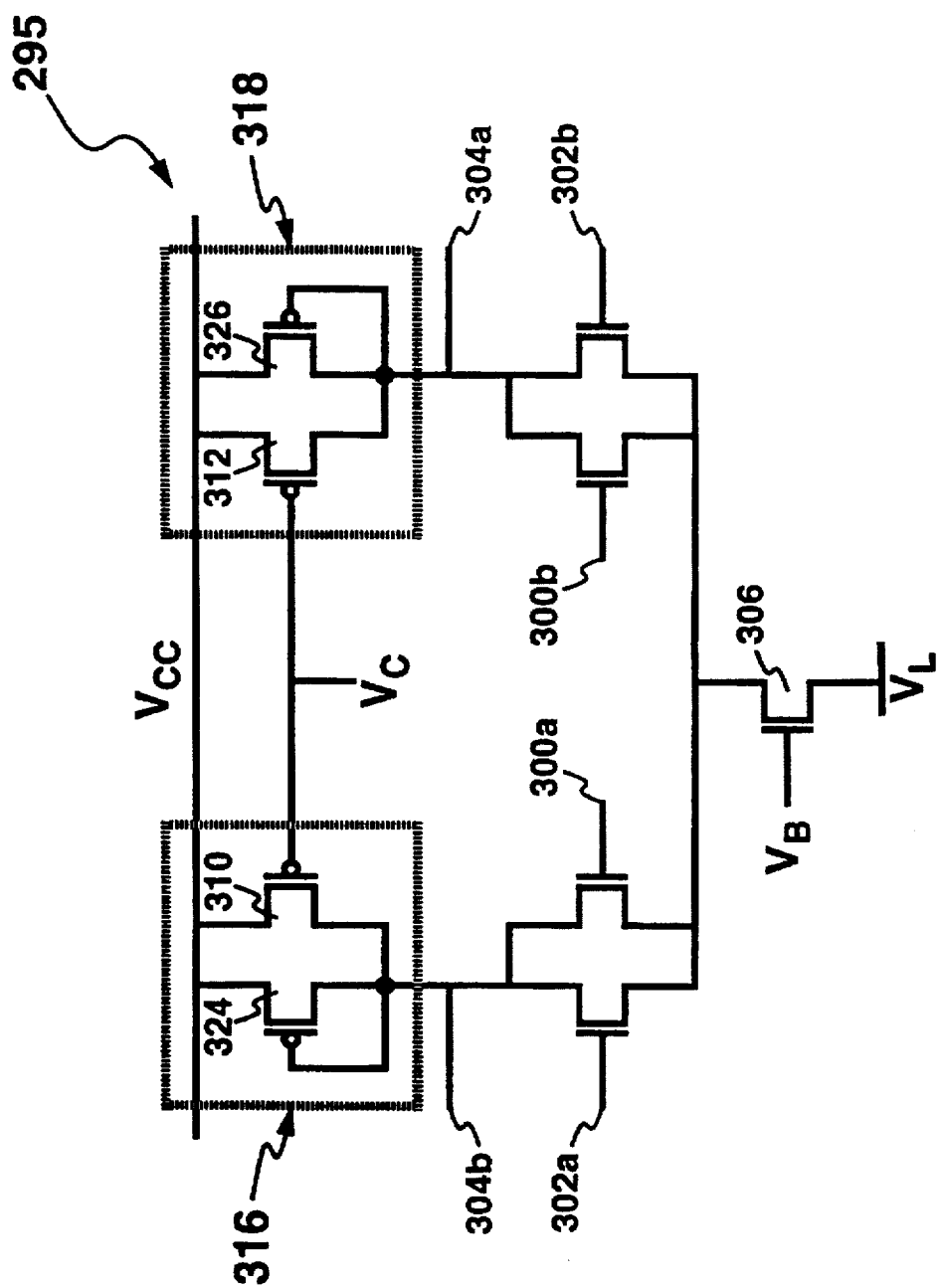
FIG. 16 is schematic of diagram of a differential buffer stage of the array oscillator.

FIG. 16 is schematic of diagram of a differential buffer stage 295 of the array oscillator configured to receive differential signals at input signal ports 300a–b and input coupling ports 302a–b, and to provide complementary buffer stage outputs at output ports 304a–b. The buffer stage 295 includes an NMOS transistor current source 306 to which is applied a current source bias $V_B$. The externally-supplied oscillation control voltage $V_C$ is seen to be applied to PMOS transistors 310 and 312 within symmetric load elements 316 and 318. The load elements 316 and 318 further include diode-connected PMOS devices 324 and 326. The biased PMOS device and the diode-connected PMOS device in each symmetric load element are equally sized to yield current-voltage characteristics. These characteristics allow enable the buffer stage to achieve high dynamic supply noise rejection through a first-order cancellation of supply noise coupling.

As mentioned above, in order to induce the array to oscillate in a preferred operative mode the array is open-circuited by partially deactivating the buffer stages within first and second adjacent rings. In this way the coupling inputs of the buffer stages within a selected ring following the pair of partially deactivated rings may be open-circuited, thereby allowing the selected ring to oscillate in the fundamental mode (C=0) at its "natural" frequency. A ring may be said to oscillate at its natural frequency when the signal transitions at the coupling and signal inputs of each buffer stage occur in phase. When the array is then closed by again activating the first and second adjacent rings, the array will begin to oscillate in the lowest allowed mode. Referring to equation (4), the lowest allowed mode will be the mode closest to the fundamental mode C=0, and will depend upon the number of buffer stages within each ring of the array and the number of buffer stage delays spanned by the connections closing the array. It will generally be desired that the closed array oscillate in the lowest allowed mode, since this results in the highest oscillation frequency.

An exemplary array initialization procedure may now be described with reference to the schematic representation of the buffer stage 295 provided by FIG. 16. Referring to FIG. 16, the buffer stages within a first ring of the array may be partially deactivated by applying the upper supply voltage $V_{CC}$ to the PMOS devices 310 and 312 in lieu of the control voltage $V_C$. The first ring will continue to oscillate, however, since the diode-connected PMOS devices 324 and 326 will remain active. The NMOS current source bias $V_B$ applied to each current source 306 within the first ring is then made to be equivalent to the lower supply voltage $V_L$ in order to turn off the current source 306 within each stage of the first ring. This sets the voltage at the outputs 304a–b of each stage within the first ring to the upper swing limit.

Within the buffer stages of a second ring oscillator adjacent to the selectively deactivated first ring oscillator, the PMOS devices 310 and 312 are turned off by applying thereto the upper supply voltage $V_{CC}$. Since the outputs 304a–b of each stage within the first ring are fixed at $V_{CC}$, the coupling inputs 302a–b of each buffer stage within the adjacent second ring connected thereto are also fixed at $V_{CC}$. As a consequence, each buffer stage within the second ring will lack the necessary gain to oscillate. Since the PMOS transistors 310 and 312 of each buffer stage within the second ring are turned off, only the diode-connected PMOS devices 324 and 326 remain active within the load elements 316 and 318 of the buffer stages within the second ring. The load elements 316 and 318 of each buffer stage within the second ring now each only require one-half of the nominal stage bias current. This results in the outputs 304a–b of each buffer stage within the second ring becoming fixed at the lower output voltage swing limit. When the correct bias voltages (i.e., $V_C$ and $V_B$) are again applied to the buffer stages within the first and second rings, the array oscillator will begin to oscillate in the lowest allowed operative mode.

Figure 17:
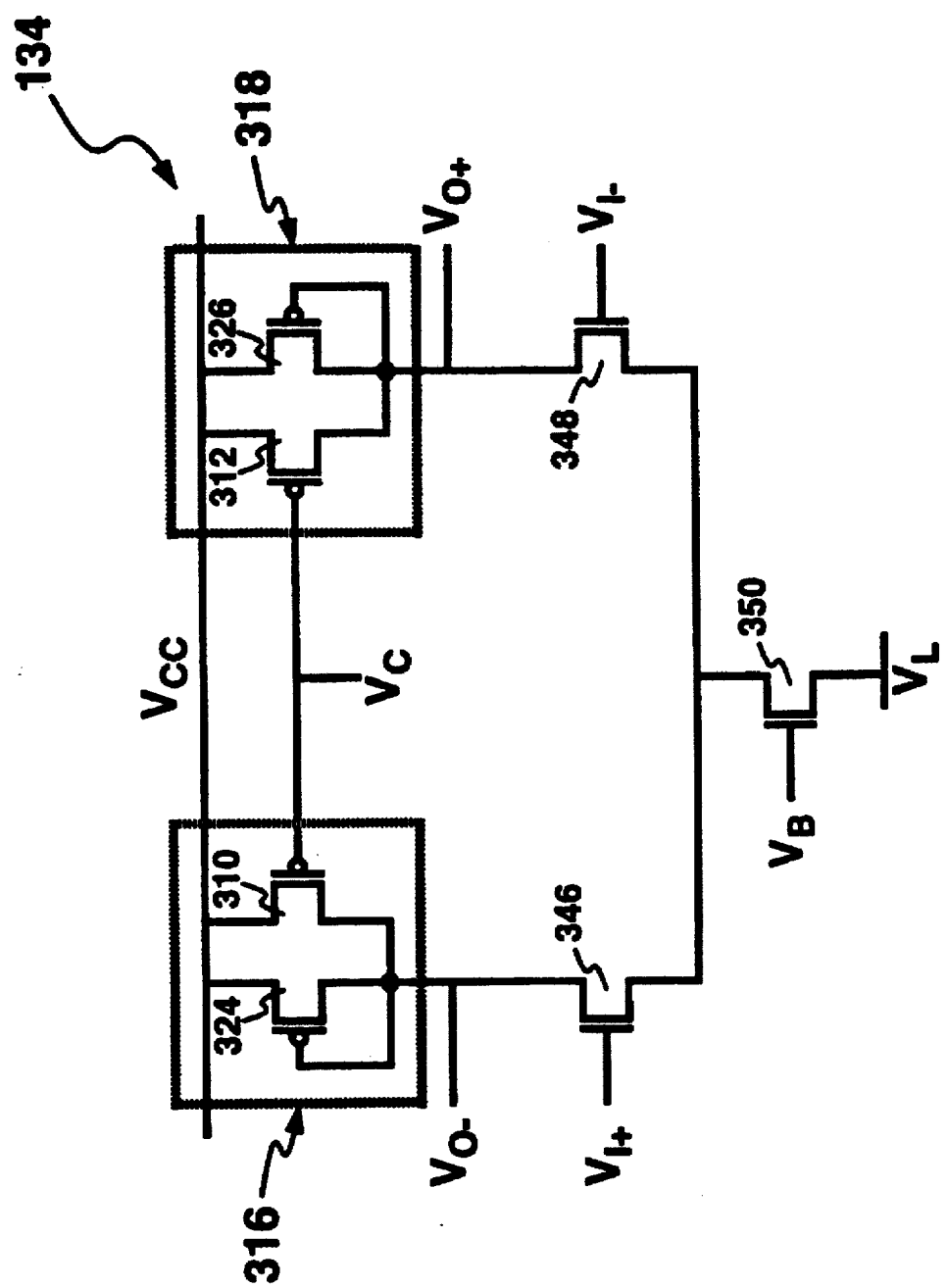
FIG. 17 depicts a schematic representation of a preferred implementation of an output channel isolation buffer.

VIII. Schematic Representation of Output Channel Isolation Buffer and Multiplexer FIG. 17 depicts a schematic representation of a preferred implementation of one of the output channel isolation buffers 134. As is indicated by FIG. 17, the isolation buffer 134 will preferably be implemented by using a circuit architecture roughly corresponding to approximately one-half of the buffer stage 295 depicted in FIG. 16. In the description of FIGS. 16 and 17 like reference numerals will be used where appropriate to describe corresponding circuit elements and nodes. The buffer 134 is configured to receive a differential signal through an input differential stage having input transistors 346 and 348. Complementary outputs are provided by the buffer 134 at output ports 304a–b. The buffer stage 134 further includes an NMOS transistor current source 350 to which is applied the current source bias $V_B$. The externally-supplied oscillation control voltage $V_C$ is again seen to be applied to PMOS transistors 310 and 312 within symmetric load elements 316 and 318. The load elements 316 and 318 further include diode-connected PMOS devices 324 and 326.

Figure 18:
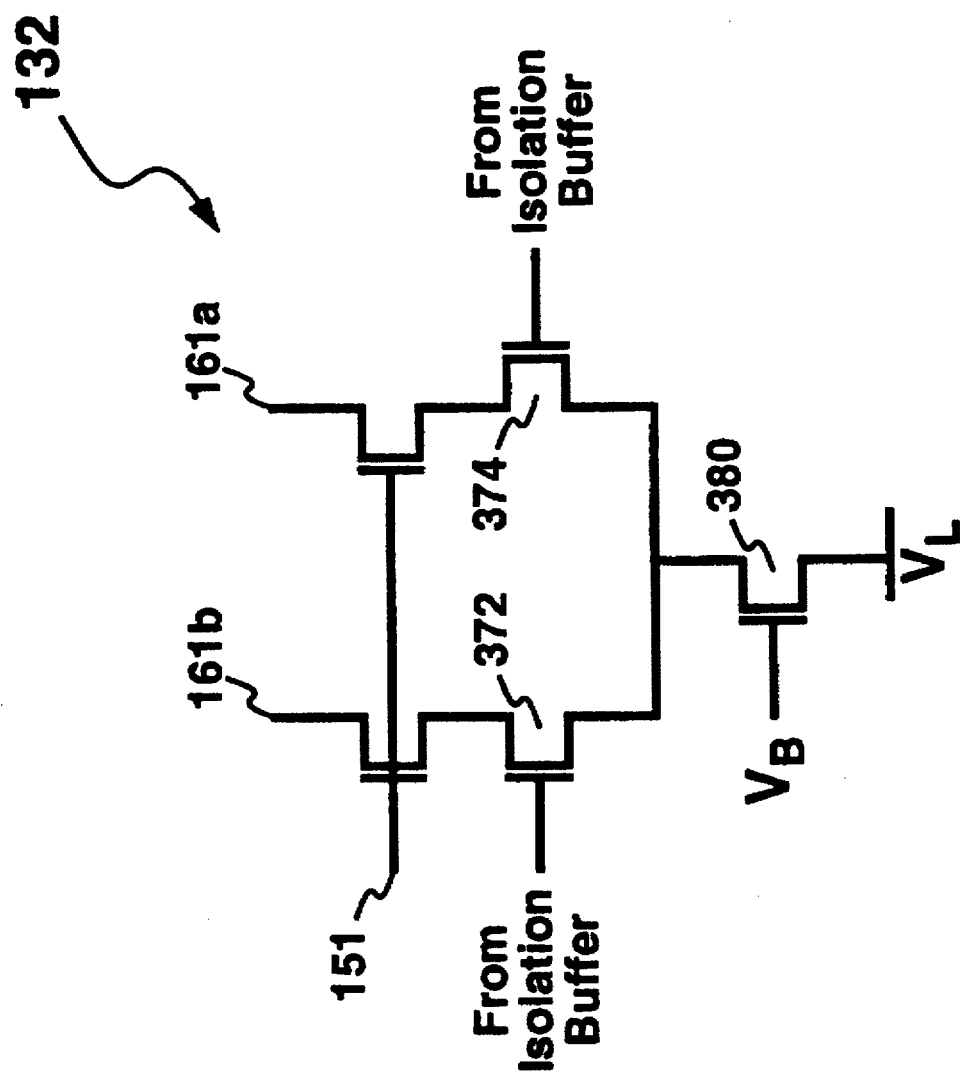
FIG. 18 shows a schematic representation of a preferred implementation of a multiplexer as configured to provide differential outputs.

Turning now to FIG. 18, there is shown a schematic representation of a preferred implementation of the multiplexer 132 as configured to provide differential outputs. A differential output from the isolation buffer 134 is seen to be received by an input pair of transistors 372 and 374. The input transistors 372 and 374 become operatively connected to the column bit lines 161a and 161b upon word line 151 enabling output transistors 376 and 378. As is indicated by FIG. 18, the multiplexer 132 is biased by a current source transistor 380 to which is applied the current source bias voltage $V_B$.

IX. Integrated Circuit Array Oscillator

Figure 19:
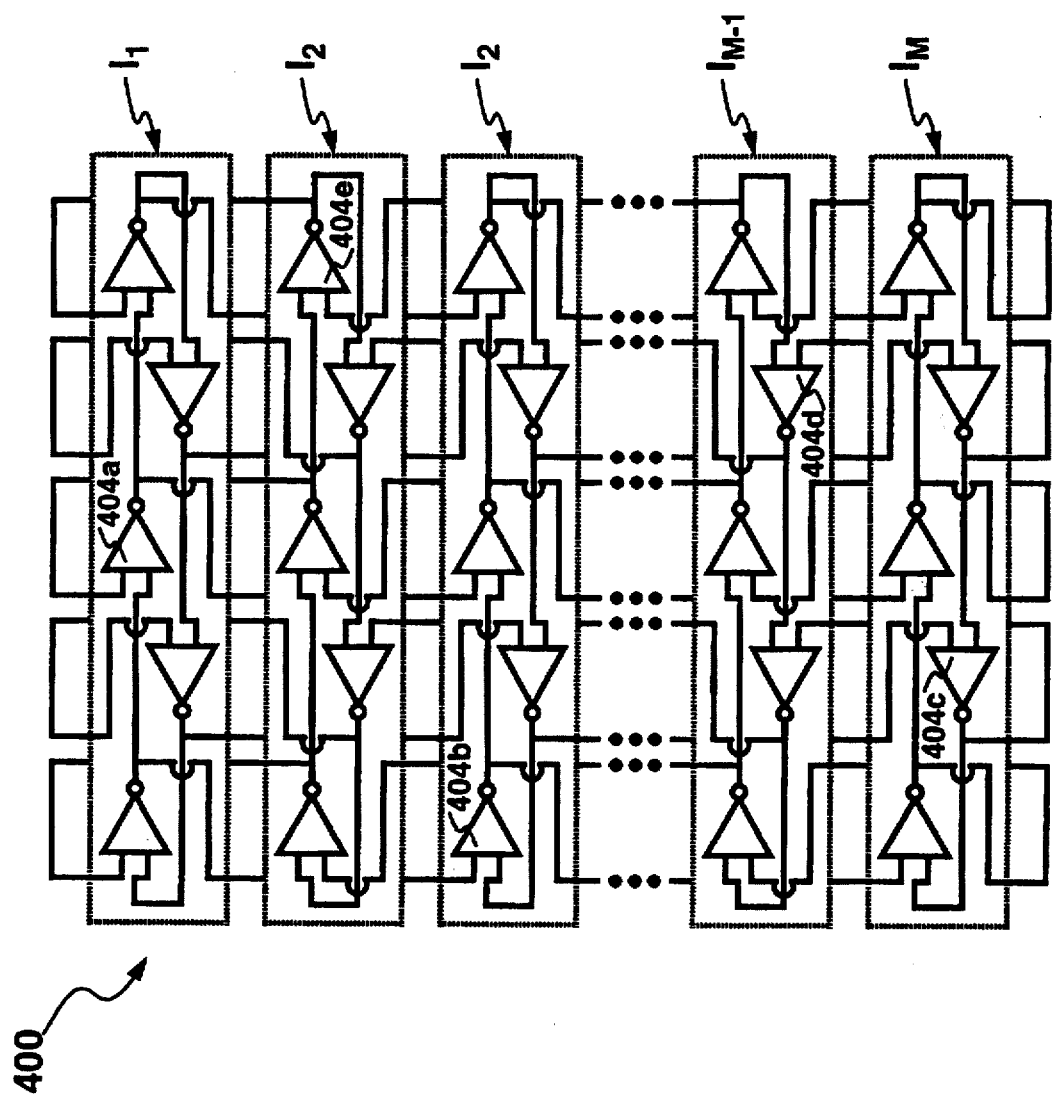
FIG. 19 depicts an exemplary integrated circuit layout of the oscillator array of the invention.

FIG. 19 depicts an exemplary integrated circuit layout of the oscillator array 400 of the invention. If phase-locked oscillation is to be achieved within the integrated circuit oscillator 400 it is necessary that the signal propagation delay between through each buffer stage interconnection be identical. In order for all such delays to be of equivalent duration, the capacitance associated with each buffer stage interconnection should be approximately equivalent. One approach to attaining the necessary balanced distribution of interconnect capacitance, exemplified by the layout of FIG. 19, involves interleaving both the buffer stages within each ring as well as well as the individual ring oscillators. In this way adjacently connected buffer stages are separated by a single buffer stage, and adjacently connected rings are separated by a single ring.

Referring now to FIG. 19, this mode of separation is seen to be inherent within the layout of the integrated circuit array oscillator 400. The array oscillator includes a set of M integrated circuit ring oscillators (i.e., rings) i=1 to M, with a single array column of buffer stages being identified as buffer stages 404a–e. The desired interleaving of rings is achieved by interconnecting the buffer stages within rings $I_1$ and $I_3$, within rings $I_2$ and $I_4$, and so on. As is indicated by FIG. 19, adjacently connected buffer stages (e.g. , stages 404a–b, and 404c–d) are horizontally separated by a single buffer stage.

The capacitance associated with the array closing connections between, for example, rings $I_1$ and $I_M$ is balanced by introducing a relative shift between the corresponding buffer stages within each adjacent ring $I_i$, rather than requiring the closing interconnections to span the entire buffer shift mandated by the array boundary conditions. In order to impose boundary conditions requiring a shift of k buffers through M rings, the number of rings M must be constrained so that $$M = yN - k \qquad (9)$$

where y is a positive integer, N denotes the number of buffer stages within each ring, and yN corresponds to the number of times the array closing connections "wrap around" through the array columns in linking the ring oscillators (e.g., $I_1$ and $I_M$) at the array boundaries.

X. Current Source Bias Circuit and Voltage Buffer Circuit

Figure 20:
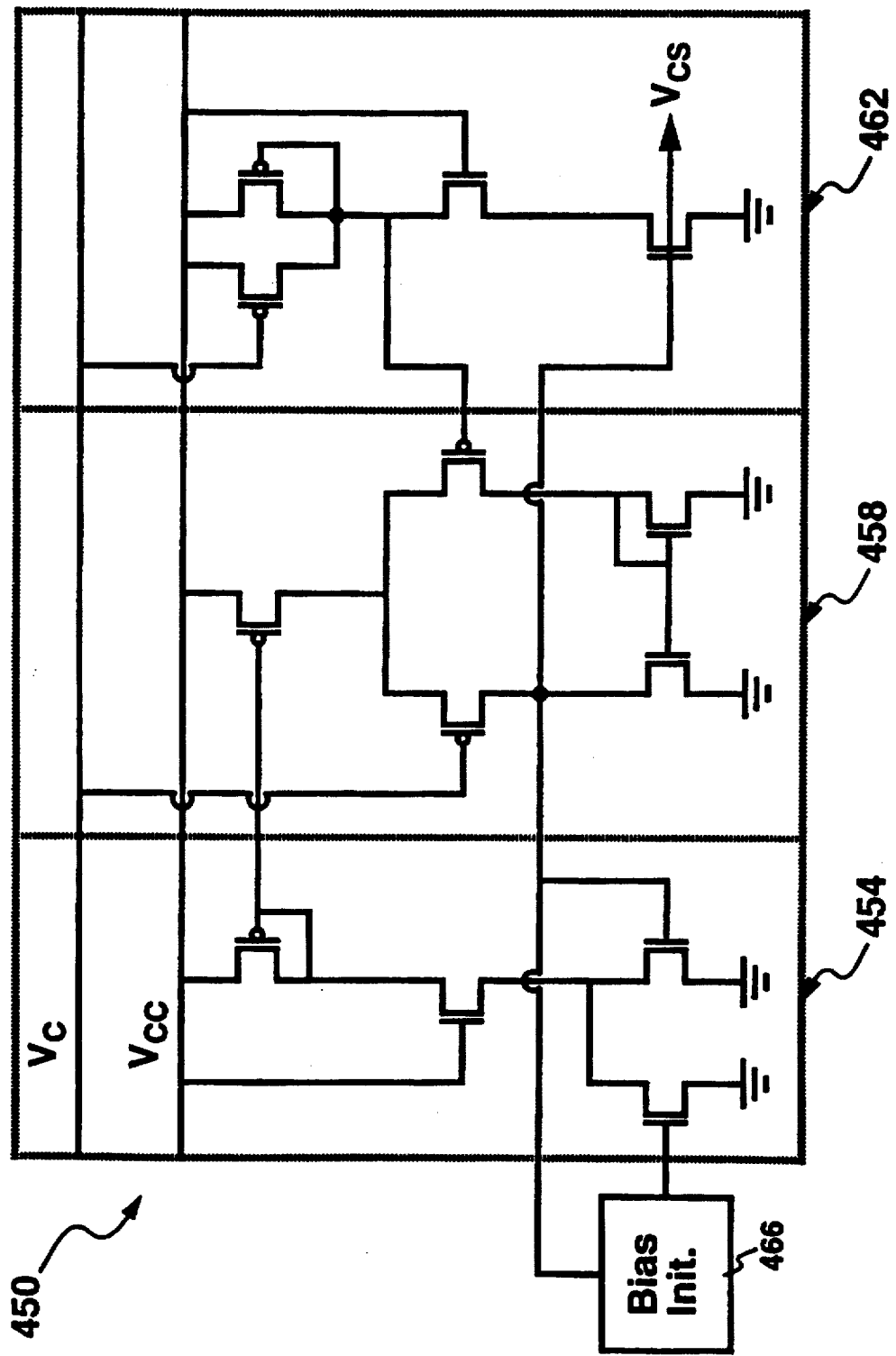
FIG. 20 illustratively represents a current source bias circuit used to bias each of the array oscillator buffer stages, as well as to bias buffer circuits within the output channel.

FIG. 20 illustratively represents a current source bias circuit 450 used to bias each of the array oscillator buffer stages, as well as the various buffers included within the output channel network. The bias circuit 450 is designed to perform at least two functions. First, the bias circuit operates to set the current through the NMOS current sources within each buffer so that symmetric load swings are provided. Second, the bias circuit 460 dynamically adjusts the NMOS current source bias such that the resultant current is held constant despite supply voltage variation.

The bias circuit 450 includes an amplifier bias stage 454, a differential amplifier stage 458, and a half-buffer replica load element 462. The amplifier bias stage 454 operates to set the magnitude of an NMOS current source so that the current source control voltage $V_{CS}$ provided by the half-buffer replica 462 load element is of a desired magnitude. The number of NMOS current source devices driven by $V_{CS}$ will generally be limited to less than ten for the case of current source device dimensions approximating the dimensions of the circuit elements within the bias circuit 450. This prevents the output recovery time of the bias circuit 450 from limiting the dynamic supply noise rejection of the buffers driven thereby.

The differential amplifier stage 458 is seen to be based upon a PMOS self-biased source-coupled pair. The amplifier stage 458 includes a stage mirroring the half-buffer replica load element 462 in order that the supply voltage requirements of the amplifier stages 454 and 458 are similar to those of the buffers driven by the bias circuit 450. The half-buffer replica load element 462 enables the current produced by each of the current sources driven by the bias circuit 450 to be substantially independent of supply voltage variation. A bias initialization circuit prevents bias circuit 450 from undesirably turning off the current sources driven thereby upon power-up.

Figure 21:
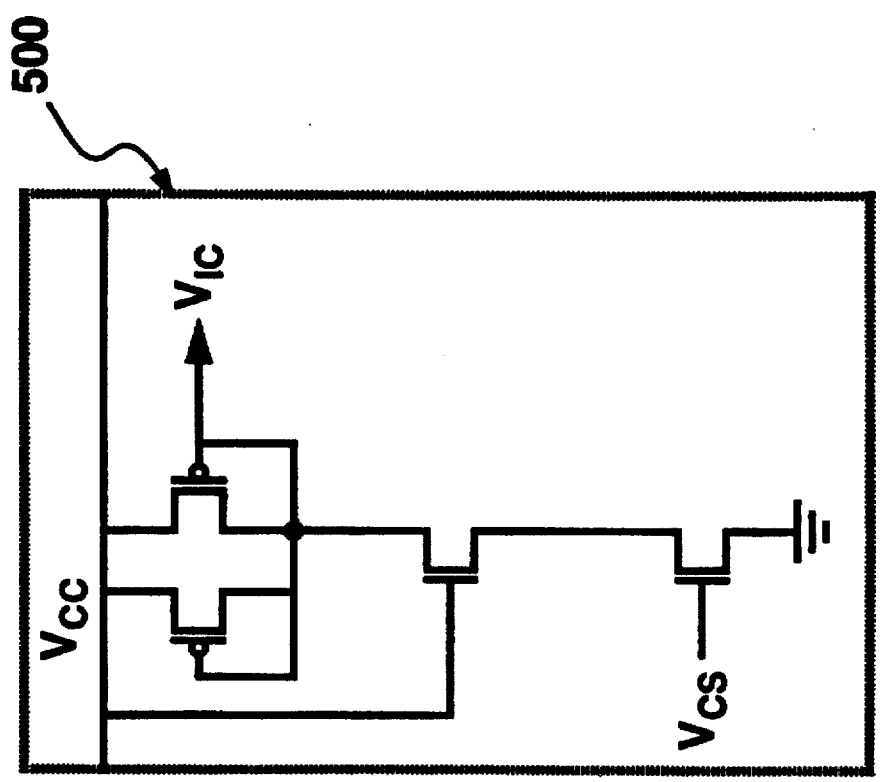
FIG. 21 depicts a schematic representation of a control voltage buffer circuit disposed to be appended to the current source bias circuit of FIG. 21.

FIG. 21 depicts a schematic representation of a control voltage buffer circuit 500 disposed to be appended to the current source bias circuit of FIG. 21. The control voltage buffer circuit 500 is designed to mitigate control voltage ($V_{CS}$) coupling to the negative supply voltage via the capacitance associated with the various interconnection lines. It may also be desired to employ the voltage buffer circuit in embodiments in which the capacitive loading upon the control voltage necessitates utilization of large loop filter capacitors. The circuit 500 includes a diode-connected load element in a half-buffer replica. As is indicated by FIG. 21, the gate of a biased PMOS device connected to the output of the load element can be used to generate an internal control voltage Vic on the basis of the NMOS current source bias. The voltage $V_{IC}$ may then be used as the PMOS bias voltage.

XI. Time Digitizer

Figure 22:
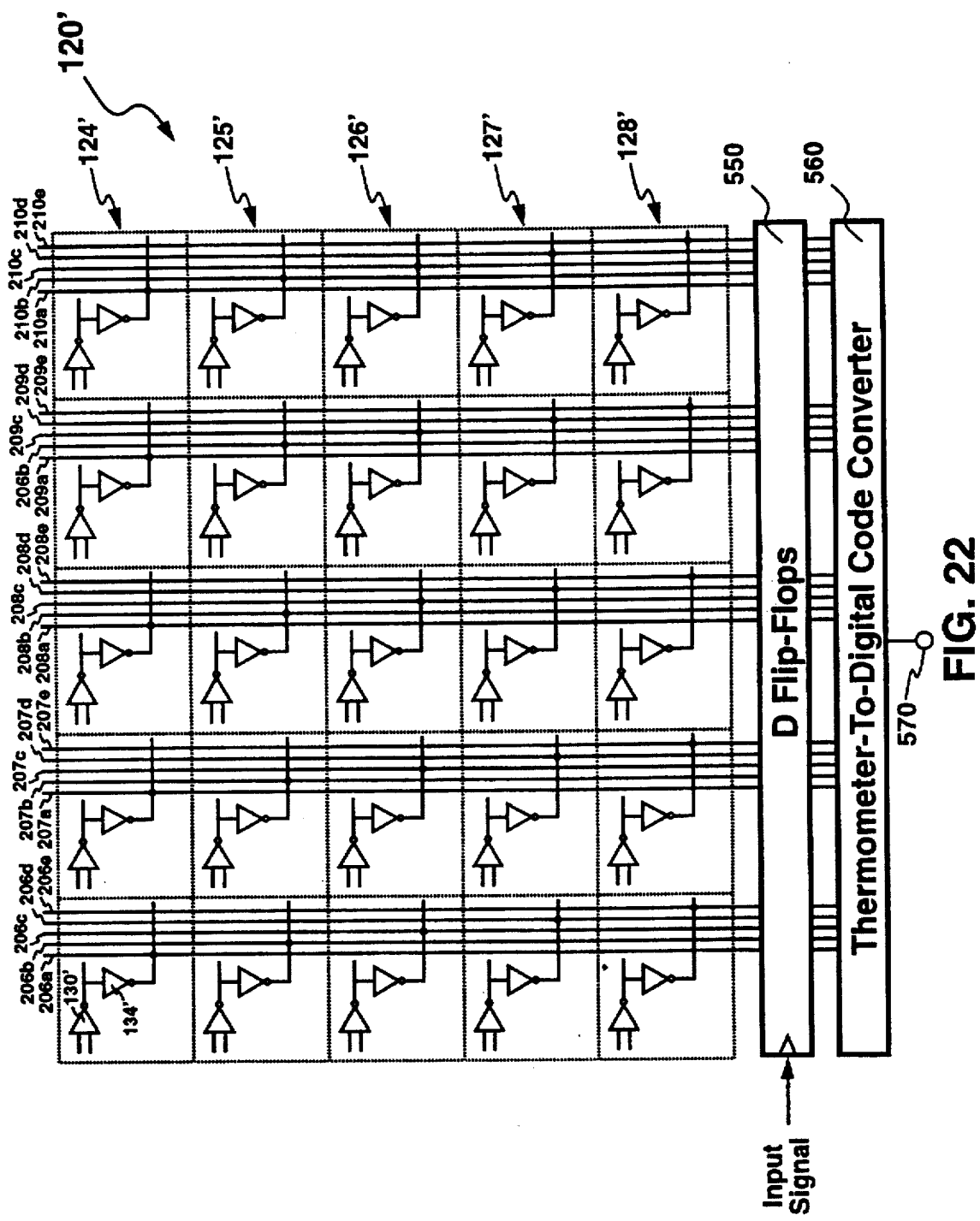
FIG. 22 illustrates the manner in which the array oscillator of the invention may be used as a time digitizer.

FIG. 22 illustrates the manner in which the array oscillator 120' of the invention may be used as a time digitizer. The time digitizer of FIG. 22 operates to determine an exact time of, for example, the zero crossing of an input signal applied to a plurality of D-type flip flops 550. Each flip-flop 550 would receive the input signal and one of the bit lines 206a–e through 210a–ea, and would serve to sense positive and/or negative transitions of the input signal to be digitized. The flip-flops 550 are clocked by the input signal and latch the state of all of the array outputs provided by the bit lines 206a–e through 210a–e. The occurrence of a transition in the input signal may then be determined by determining the pairs of array outputs where the latched data transitions from low-to-high, and also from high-to-low in the case of differential stages.

The outputs of the flip-flops 550 are encoded by a thermometer code to digital code converter 560. The converter 560 may internally use grey code encoding or the like in order to minimize error. The resulting digital code is provided at output port 570.

XII. Delay Line Oscillator

Figure 23:
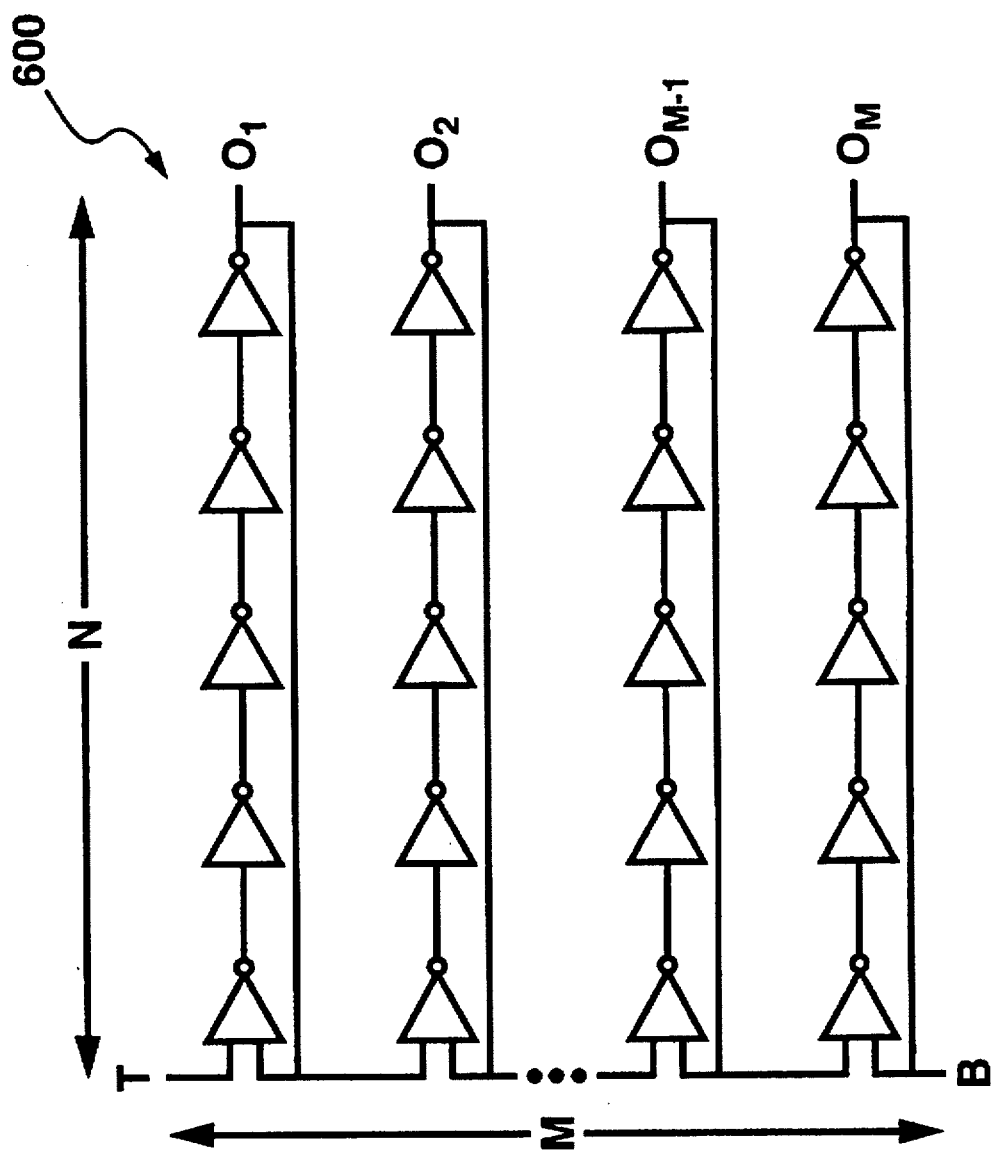
FIG. 23 provides a block diagram representation of a delay line oscillator 600 having an input (T) and an output (B)

FIG. 23 provides a block diagram representation of a delay line oscillator 600 having an input (T) and an output (B). The delay line oscillator 600 is analogous to the array oscillators described above, but uses ring oscillators rather than buffer stages as delay elements and is disposed to receive only periodic signals at the input (T). Referring to FIG. 23, the delay line oscillator includes a set of M delay elements defining outputs $O_i$, i=1 to M. Each delay element may be implemented using a ring oscillator based on single-input inverting buffers, but in which the first buffer of each ring comprises a dual-input inverting buffer. One input of the each dual-input inverting buffer serves as the input to the associated delay element, while the signal applied to the other input of the dual-input inverting buffer constitutes the output of the delay element. Each delay element may delay an applied input signal over a positive and negative range. The delay line oscillator 600 is designed to advantageously delay periodic signals applied to the input (T) by arbitrarily small equal delay increments.

XIII. Coupled Oscillator Ring

Figure 24:
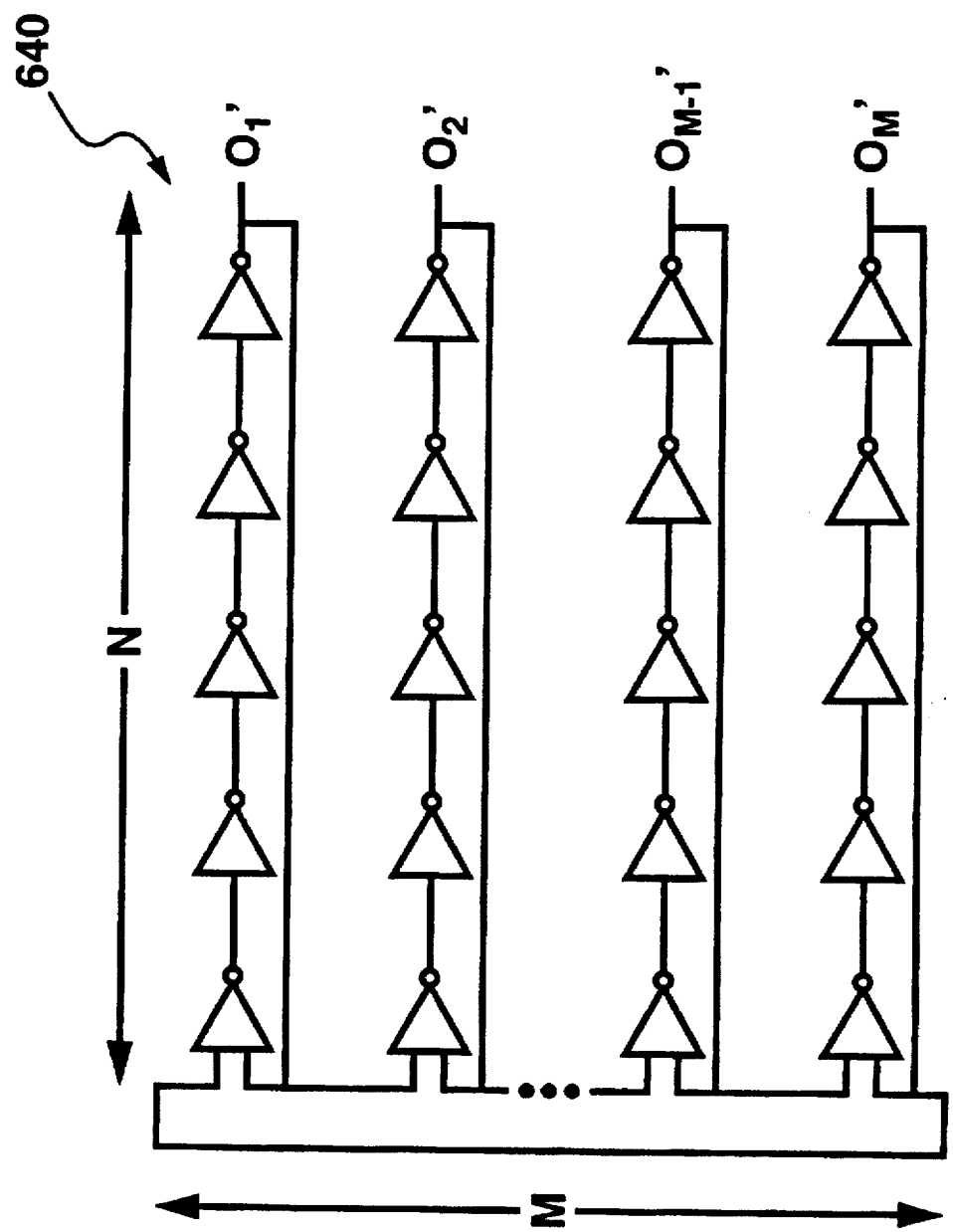
FIG. 24 is a block diagram of a coupled ring oscillator which may be formed by connecting the input (T) of the delay line oscillator of FIG. 23 to the output (B) thereof.

FIG. 24 is a block diagram of a coupled ring oscillator 640 which may be formed by connecting the input (T) of the delay line oscillator 600 (FIG. 23) to the output (B) thereof. The structure of the coupled ring oscillator 640 may thus be described as consisting of a ring of coupled ring oscillators. The maximum oscillation frequency of the coupled ring oscillator 640 is largely independent of the number of ring stages, and depends primarily on the number of stages within each ring. Consequently, if a minimum number of buffers are used in each ring stage, a large oscillation frequency may be produced.

XIV. Look-Ahead Ring Oscillator

Figure 25:
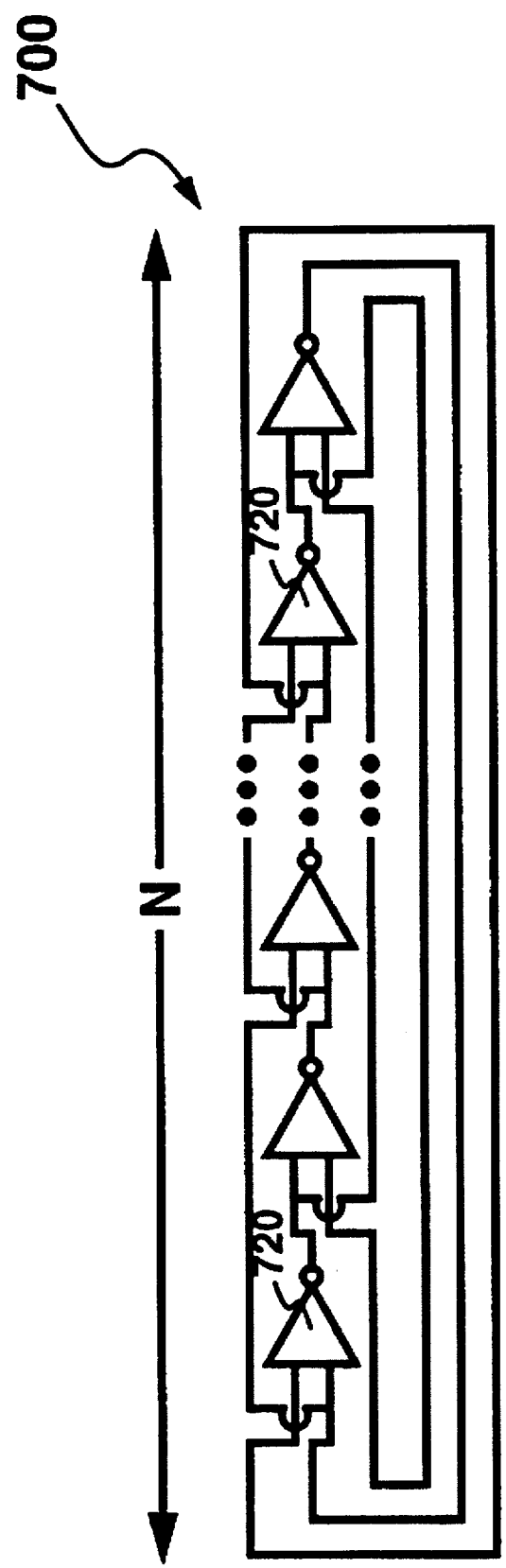
FIG. 25 shows a block diagram of a look-ahead ring oscillator in accordance with the invention.

FIG. 25 shows a block diagram of a look-ahead ring oscillator 700 in accordance with the invention. In particular, the embodiment of FIG. 25 corresponds to a "look-ahead by two" ring oscillator. A look-ahead ring oscillator may generally be described as being similar to a ring oscillator incorporating single-input inverting buffers, but which uses buffer outputs earlier within each ring to "speed up" signal propagation through the ring. The look-ahead ring oscillator 700 includes a ring of N dual-input inverting buffers 720. A first input of a given buffer 720 is connected to the output of the previous buffer, while the second input is connected to the buffer 720 preceding the given buffer 720 by two buffer stages. In a "look ahead by N" ring oscillator, the second input would be connected to the output of a buffer preceeding the given buffer by 2N+1 buffer stages, where N is greater than zero.

XV. Phase Bisector

Figure 26:
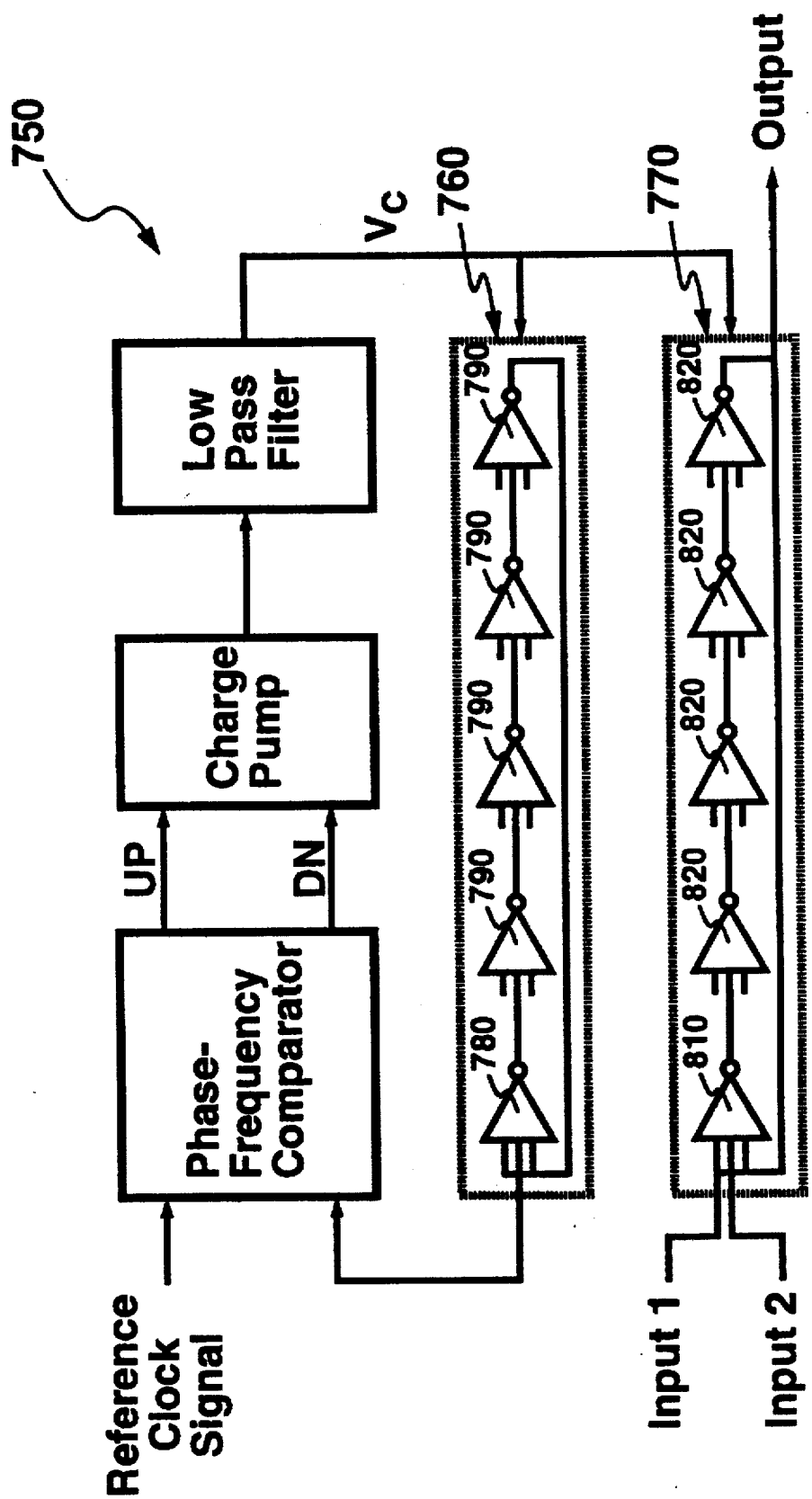
FIG. 26 shows a phase locked loop in which is incorporated a phase bisector of the present invention.

Referring to FIG. 26, there is shown a phase locked loop 750 in which is incorporated a phase bisector of the present invention. The phase bisector includes first and second oscillating ring networks 760 and 770. The first ring network includes a first triple-input inverting buffer 780, and a first plurality of single-input inverting buffers 790. Similarly, the second ring network 770 includes a second triple-input inverting buffer 810, and a second plurality of single-input inverting buffers 820. The triple-input inverting buffers 760 and 770 may be formed from a circuit which divides one of the inputs to a dual-input buffer stage in the same manner that the two inputs of such a dual-input buffer stage are nominally divided.

In operation, the phase bisector produces an output signal having a phase offset equivalent to the average of the phase offsets of two periodic input signals (Input 1 and Input 2) of identical frequency. The phase locked loop 750 establishes the ring stage control voltage $V_C$ so that the natural frequency of the ring stage is equivalent to the frequency of the input phases to be bisected. Since the frequency at the inputs is equal to the natural frequency of the ring stage, the phase offset at the output will be equal to the phase offset at the inputs if both inputs are at the same phase. If the inputs are at different phases, the phase offset at the output will be equal to the average of the phase offsets at the inputs.

While the present invention has been described with reference to a few specific embodiments, the description is illustrative of the invention and is not to be construed as limiting the invention. Various modifications may occur to those skilled in the art without departing from the true spirit and scope of the invention as defined by the appended claims.

What is claimed is:

1. An oscillator circuit, comprising:

a ring oscillator having a plurality of interconnected buffer stages;

at least a subset of said buffer stages each including:

a differential transistor pair having first and second drain outputs and a common source output;

a transistor current source coupled to said common source output; and first and second load elements coupled to said first and second drain outputs, respectively, each load element including a set of transistors that together form a load having a substantially symmetric voltage-current characteristic so as to provide high common mode noise rejection; wherein the set of transistors of each said load element includes first and second transistors, and the second transistor of each said load element is diode connected with a gate connected to a drain node of the second transistor;

wherein said first and second drain outputs oscillate between voltages of $V_{CC}$ and $v_C$, where $V_{CC}$ is a power supply voltage applied to said buffer stage and $V_C$ is an oscillation speed control voltage applied to the first transistor of each of said load elements to control said buffer stage's speed of operation.

2. The oscillator circuit of claim 1, further including a current source bias circuit that generates a gate voltage for said transistor current source of each buffer stage in said subset of said buffer stages, said current source bias circuit comprising:

a half-buffer replica of one of said buffer stages, including one load element, a transistor current source, and an input transistor coupled between the load element and the transistor current source; wherein said half-buffer replica's input transistor has a gate coupled to said $V_{CC}$ power supply voltage, said half-buffer replica generating an output signal;

a differential amplifier having first and second inputs, said first input coupled to said half-buffer replica so as to receive said half-buffer replica's output signal and said second input coupled to said $V_C$ speed control voltage, said differential amplifier generating as an output a bias control voltage $V_B$ that is coupled to the transistor current sources of said half-buffer replica and said buffer stages, wherein said differential amplifier is coupled to said half-replica buffer in a negative feedback arrangement such that the bias control voltage $V_B$ is automatically adjusted until said half-buffer replica's output signal has a voltage substantially equal to said oscillation speed control voltage $V_C$;

wherein said current source bias circuit automatically adjusts said bias control voltage $V_B$ such that each said buffer circuit's current usage remains substantially unchanged due to small variations in said power supply voltage $V_{CC}$.

3. The oscillator circuit of claim 2, said current source bias circuit including:

a current mirror for supplying to the differential amplifier a current equal to current used by one said buffer stage.

4. The oscillator circuit of claim 2, including:

a second buffer replica circuit having a load element, a transistor current source, and an input transistor coupled between the load element and the transistor current source; wherein said second buffer replica's input transistor has a gate coupled to said $V_{CC}$ power supply voltage, and said transistor current source has a gate coupled to said bias control voltage $V_B$, said second buffer replica circuit generating an output signal comprising an internal oscillation speed control signal $V_{IC}$, wherein said internal oscillation speed control signal $V_{IC}$ has a voltage equal to said speed control signal voltage $V_C$ and is coupled to said load elements of said buffer stages such that said speed control signal $V_C$ is protected from capacitive coupling of noise to said internal oscillation speed control signal $V_{IC}$.

5. The oscillator circuit of claim 1, wherein the first and second transistors of each said load element are equally sized.

6. The oscillator circuit of claim 5, where said oscillation speed control voltage $V_C$ is applied to said first transistor in each said load element to control said buffer stage's speed of operation; and wherein said second transistor in each said load element is diode connected with a gate connected to a drain node of said second transistor.

7. The oscillator circuit of claim 1, wherein the first and second transistors of each said load element are equally sized PMOS transistors.

8. The oscillator circuit of claim 7, where said oscillation speed control voltage $V_C$ is applied to said first transistor in each said load element to control said buffer stage's speed of operation; and wherein said second transistor in each said load element is diode connected with a gate connected to a drain node of said second transistor.

9. The oscillator circuit of claim 1, further including a current source bias circuit that generates a gate voltage for said transistor current source of each buffer stage in said subset of said buffer stages, said current source bias circuit comprising:

a buffer replica that replicates at least a portion of one of said buffer stages, said buffer replica including a load element, a transistor current source, and an input transistor coupled between the load element and the transistor current source; wherein said buffer replica's input transistor has a gate coupled to said $V_{CC}$ power supply voltage, said buffer replica generating an output signal;

a differential amplifier having first and second inputs, said first input coupled to said buffer replica so as to receive said buffer replica's output signal and said second input coupled to said $V_C$ speed control voltage, said differential amplifier generating as an output a bias control voltage $V_B$ that is coupled to the transistor current sources of said buffer replica and said buffer stages, wherein said differential amplifier is coupled to said replica buffer in a negative feedback arrangement such that the bias control voltage $V_B$ is automatically adjusted until said buffer replica's output signal has a voltage substantially equal to said $V_C$ speed control voltage;

wherein said current source bias circuit automatically adjusts said bias control voltage $V_B$ such that each said buffer circuit's current usage remains substantially unchanged due to small variations in said power supply voltage $V_{CC}$.

10. The oscillator circuit of claim 9, said current source bias circuit including:

a current mirror for supplying to the differential amplifier a current equal to current used by one said buffer stage.

11. The oscillator circuit of claim 9, including:

a second buffer replica circuit having a transistor current source with a gate coupled to said bias control voltage $V_B$, said second buffer replica circuit generating an output signal comprising an internal oscillation speed control signal $V_{IC}$, wherein said internal oscillation speed control signal $V_{IC}$ has a voltage equal to said speed control signal voltage $V_C$ and is coupled to said load elements of said buffer stages such that said speed control signal $V_C$ is protected from capacitive coupling of noise to said internal oscillation speed control signal $V_{IC}$.

12. A delay circuit, comprising:

a plurality of interconnected buffer stages;

at least a subset of said buffer stages each including:

a differential transistor pair having first and second drain outputs and a common source output;

a transistor current source coupled to said common source output; and first and second load elements coupled to said first and second drain outputs, respectively, each said load element including a set of transistors that together form a load having a substantially symmetric voltage-current characteristic so as to provide high common mode noise rejection; wherein the set of transistors of each said load element includes first and second transistors, and the second transistor of each said load element is diode connected with a gate connected to a drain node of the second transistor;

wherein said first and second drain outputs range between voltages of $V_{CC}$ and $V_C$, where $V_{CC}$ is a power supply voltage applied to said buffer stage and $V_C$ is a speed control voltage applied to the first transistor of each of said load elements to control said buffer stage's speed of operation.

13. The delay circuit of claim 12, further including a current source bias circuit that generates a gate voltage for said transistor current source of each buffer stage in said subset of said buffer stages, said current source bias circuit comprising:

a half-buffer replica of one of said buffer stages, including a load element, a transistor current source, and an input transistor coupled between the load element and the transistor current source; wherein said half-buffer replica's input transistor has a gate coupled to said $V_{CC}$ power supply voltage, said half-buffer replica generating an output signal;

a differential amplifier having first and second inputs, said first input coupled to said half-buffer replica so as to receive said half-buffer replica's output signal and said second input coupled to said $V_C$ speed control voltage, said differential amplifier generating as an output a bias control voltage $V_B$ that is coupled to the transistor current sources of said half-buffer replica and said buffer stages, wherein said differential amplifier is coupled to said half-replica buffer in a negative feedback arrangement such that the bias control voltage $V_B$ is automatically adjusted until said half-buffer replica's output signal has a voltage substantially equal to said speed control voltage $V_C$;

wherein said current source bias circuit automatically adjusts said bias control voltage $V_B$ such that each said buffer circuit's current usage remains substantially unchanged due to small variations in said power supply voltage $V_{CC}$.

14. The delay circuit of claim 13, said current source bias circuit including:

a current mirror for supplying to the differential amplifier a current equal to current used by one said buffer stage.

15. The delay circuit of claim 13, including:

a second buffer replica circuit having a load element, a transistor current source, and an input transistor coupled between the load element and the transistor current source; wherein said second buffer replica's input transistor has a gate coupled to said $V_{CC}$ power supply voltage, and said transistor current source has a gate coupled to said bias control voltage $V_B$, said second buffer replica circuit generating an output signal comprising an internal speed control signal $V_{IC}$, wherein said internal speed control signal $V_{IC}$ has a voltage equal to said speed control signal voltage $V_C$ and is coupled to said load element of said buffer stages such that said speed control signal $V_C$ is protected from capacitive coupling of noise to said internal speed control signal $V_{IC}$.

16. The delay circuit of claim 12, wherein said the first and second transistors of each of said load elements are equally sized.

17. The delay circuit of claim 16, where said oscillation speed control voltage $V_C$ is applied to said first transistor in each said load element to control said buffer stage's speed of operation; and wherein said second transistor in each said load element is diode connected with a gate connected to a drain node of said second transistor.

18. The delay circuit of claim 12, wherein the first and second transistors of each said load elements are equally sized.

19. The delay circuit of claim 18, where said oscillation speed control voltage $V_C$ is applied to said first transistor in' each said load element to control said buffer stage's speed of operation; and wherein said second transistor in each said load element is diode connected with a gate connected to a drain node of said second transistor.

20. The delay circuit of claim 12, further including a current source bias circuit that generates a gate voltage for said transistor current source of each buffer stage in said subset of said buffer stages, said current source bias circuit comprising:

- a buffer replica that replicates at least a portion of one of said buffer stages, said buffer replica including a load element, a transistor current source, and an input transistor coupled between the load element and the transistor current source; wherein said buffer replica's input transistor has a gate coupled to said $V_{CC}$ power supply voltage, said buffer replica generating an output signal;
- a differential amplifier having first and second inputs, said first input coupled to said buffer replica so as to receive said buffer replica's output signal and said second input coupled to said $V_C$ speed control voltage, said differential amplifier generating as an output a bias control voltage $V_B$ that is coupled to the transistor current sources of said buffer replica and said buffer stages, wherein said differential amplifier is coupled to said replica buffer in a negative feedback arrangement such that the bias control voltage $V_B$ is automatically adjusted until said buffer replica's output signal has a voltage substantially equal to said $V_C$ speed control voltage;

wherein said current source bias circuit automatically adjusts said bias control voltage $V_B$ such that each said buffer circuit's current usage remains substantially unchanged due to small variations in said power supply voltage $V_{CC}$.

21. The delay circuit of claim 20, said current source bias circuit including:

a current mirror for supplying to the differential amplifier a current equal to current used by one said buffer stage.

22. The delay circuit of claim 20, including:

a second buffer replica circuit having a transistor current source with a gate coupled to said bias control voltage $V_B$, said second buffer replica circuit generating an output signal comprising an internal speed control signal $V_{IC}$, wherein said internal speed control signal $V_{IC}$ has a voltage equal to said speed control signal voltage $V_C$ and is coupled to said load elements of said buffer stages such that said speed control signal $V_C$ is protected from capacitive coupling of noise to said internal speed control signal $V_{IC}$.

* * * * *